United States Patent
Cernea et al.

(10) Patent No.: US 7,551,484 B2
(45) Date of Patent: *Jun. 23, 2009

(54) NON-VOLATILE MEMORY AND METHOD WITH REDUCED SOURCE LINE BIAS ERRORS

(75) Inventors: Raul-Adrian Cernea, Santa Clara, CA (US); Yan Li, Milpitas, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/620,946

(22) Filed: Jan. 8, 2007

(65) Prior Publication Data

US 2007/0109889 A1 May 17, 2007

Related U.S. Application Data

(63) Continuation of application No. 10/254,830, filed on Sep. 24, 2002, now Pat. No. 7,196,931.

(51) Int. Cl.
*G11C 16/06* (2006.01)

(52) U.S. Cl. .................. 365/185.21; 365/203; 365/205

(58) Field of Classification Search .............. 365/203, 365/185.21, 205, 195, 189.07, 189.05, 185, 365/17, 185.18
See application file for complete search history.

(56) References Cited

U.S. PATENT DOCUMENTS

| 4,357,685 A | 11/1982 | Daniele et al. |
| 4,785,427 A | 11/1988 | Young |
| 5,012,447 A | 4/1991 | Matsuda et al. |
| 5,021,999 A | 6/1991 | Kohda et al. |
| 5,070,032 A | 12/1991 | Yuan et al. |
| 5,093,806 A | 3/1992 | Tran |
| 5,095,344 A | 3/1992 | Harari |
| 5,172,338 A | 12/1992 | Mehrotra et al. |

(Continued)

FOREIGN PATENT DOCUMENTS

EP      1134746 A2    9/2001

(Continued)

OTHER PUBLICATIONS

USPTO, "Office Action," mailed in related U.S. Appl. No. 11/621,750 on Mar. 8, 2007, 10 pages.

(Continued)

*Primary Examiner*—David Lam
(74) *Attorney, Agent, or Firm*—Davis Wright Tremaine LLP

(57) ABSTRACT

Source line bias is an error introduced by a non-zero resistance in the ground loop of the read/write circuits. During sensing the control gate voltage of a memory cell is erroneously biased by a voltage drop across the resistance. This error is minimized when the current flowing though the ground loop is reduced. A method for reducing source line bias is accomplished by read/write circuits with features and techniques for multi-pass sensing. When a page of memory cells are being sensed in parallel, each pass helps to identify and shut down the memory cells with conduction current higher than a given demarcation current value. In this way, sensing in subsequent passes will be less affected by source line bias since the total amount of current flow is significantly reduced by eliminating contributions from the higher current cells.

14 Claims, 20 Drawing Sheets

U.S. PATENT DOCUMENTS

| | | |
|---|---|---|
| 5,241,494 A | 8/1993 | Blyth et al. |
| 5,245,571 A | 9/1993 | Takahashi |
| 5,313,421 A | 5/1994 | Guterman et al. |
| 5,315,541 A | 5/1994 | Harari et al. |
| 5,343,063 A | 8/1994 | Yuan et al. |
| 5,418,752 A | 5/1995 | Harari et al. |
| 5,444,656 A | 8/1995 | Bauer et al. |
| 5,537,356 A | 7/1996 | Akaogi et al. |
| 5,555,203 A | 9/1996 | Shiratake et al. |
| 5,570,315 A | 10/1996 | Tanaka et al. |
| 5,595,924 A | 1/1997 | Yuan et al. |
| 5,650,970 A | 7/1997 | Kai |
| 5,661,053 A | 8/1997 | Yuan |
| 5,768,192 A | 6/1998 | Eitan |
| 5,774,397 A | 6/1998 | Endoh et al. |
| 5,806,082 A | 9/1998 | Shaw |
| 5,860,082 A | 1/1999 | Smith et al. |
| 5,872,739 A | 2/1999 | Womack |
| 5,886,919 A | 3/1999 | Morikawa et al. |
| 5,903,495 A | 5/1999 | Takeuchi et al. |
| 5,914,903 A * | 6/1999 | Kanma et al. .......... 365/189.15 |
| 5,920,502 A | 7/1999 | Noda et al. |
| 5,949,720 A | 9/1999 | Brady |
| 5,978,271 A | 11/1999 | Sato et al. |
| 6,011,287 A | 1/2000 | Itoh et al. |
| 6,011,725 A | 1/2000 | Eitan |
| 6,046,935 A | 4/2000 | Takeuchi et al. |
| 6,046,940 A | 4/2000 | Takeuchi et al. |
| 6,061,270 A | 5/2000 | Choi |
| 6,062,270 A | 5/2000 | Hultberg et al. |
| 6,097,638 A | 8/2000 | Himeno et al. |
| 6,191,975 B1 | 2/2001 | Shimizu et al. |
| 6,191,977 B1 | 2/2001 | Lee |
| 6,222,762 B1 | 4/2001 | Guterman et al. |
| 6,252,798 B1 | 6/2001 | Satoh et al. |
| 6,260,104 B1 | 7/2001 | Roohparvar |
| 6,301,153 B1 | 10/2001 | Takeuchi et al. |
| 6,307,783 B1 | 10/2001 | Parker |
| 6,373,746 B1 | 4/2002 | Takeuchi et al. |
| 6,385,110 B1 | 5/2002 | Deguchi |
| 6,407,953 B1 | 6/2002 | Cleeves |
| 6,438,038 B2 | 8/2002 | Ikehashi et al. |
| 6,490,199 B2 | 12/2002 | Lee et al. |
| 6,504,757 B1 | 1/2003 | Hollmer et al. |
| 6,519,180 B2 | 2/2003 | Tran et al. |
| 6,522,592 B2 | 2/2003 | Van De Graaff |
| 6,535,434 B2 | 3/2003 | Maayan et al. |
| 6,545,917 B2 | 4/2003 | Kim |
| 6,556,508 B2 | 4/2003 | Tsao et al. |
| 6,650,570 B2 | 11/2003 | Tanzawa et al. |
| 6,717,851 B2 | 4/2004 | Mangan et al. |
| 6,731,539 B1 | 5/2004 | Wong |
| 6,744,667 B2 | 6/2004 | Yamamoto et al. |
| 6,747,899 B2 | 6/2004 | Hsia et al. |
| 6,751,129 B1 | 6/2004 | Gongwer |
| 6,807,103 B2 | 10/2004 | Cavaleri et al. |
| 6,829,185 B2 | 12/2004 | Beer |
| 6,859,394 B2 | 2/2005 | Matsunaga et al. |
| 6,956,770 B2 | 10/2005 | Khalid et al. |
| 6,983,428 B2 | 1/2006 | Cernea |
| 6,987,693 B2 | 1/2006 | Cernea et al. |
| 7,023,736 B2 | 4/2006 | Cernea et al. |
| 7,046,568 B2 | 5/2006 | Cernea |
| 7,064,980 B2 | 6/2006 | Cernea et al. |
| 7,196,931 B2 * | 3/2007 | Cernea et al. .......... 365/185.21 |
| 7,212,445 B2 | 5/2007 | Cernea et al. |
| 2001/0006479 A1 | 7/2001 | Ikehashi et al. |
| 2002/0036925 A1 | 3/2002 | Tanzawa et al. |
| 2002/0039322 A1 | 4/2002 | Tran et al. |
| 2002/0118574 A1 | 8/2002 | Gongwer et al. |
| 2002/0126532 A1 | 9/2002 | Matsunaga et al. |
| 2004/0057285 A1 | 3/2004 | Cernea et al. |
| 2004/0057287 A1 | 3/2004 | Cernea et al. |
| 2004/0057318 A1 | 3/2004 | Cernea et al. |
| 2004/0060031 A1 | 3/2004 | Cernea et al. |
| 2004/0109357 A1 | 6/2004 | Cernea et al. |
| 2005/0057965 A1 | 3/2005 | Cernea et al. |
| 2005/0169082 A1 | 8/2005 | Cernea |
| 2006/0034121 A1 | 2/2006 | Khalid et al. |
| 2006/0158935 A1 | 7/2006 | Chan et al. |
| 2006/0158947 A1 | 7/2006 | Chan et al. |

FOREIGN PATENT DOCUMENTS

| | | |
|---|---|---|
| EP | 1164595 A1 | 12/2001 |
| EP | 1 248 260 A1 | 10/2002 |
| EP | 1288964 A2 | 3/2003 |
| EP | 1 467 377 A | 10/2004 |
| GB | 2 332 766 A | 6/1999 |
| JP | 11-96783 A | 4/1999 |
| JP | 11-167800 A | 6/1999 |
| JP | 2001-325796 A | 11/2001 |
| WO | WO 02/069340 A1 | 9/2002 |
| WO | WO 2004/029984 A | 4/2004 |
| WO | WO 2005/029502 A1 | 3/2005 |
| WO | WO 2006/065501 A1 | 6/2006 |

OTHER PUBLICATIONS

USPTO, "Notice of Allowance and Fee(s) Due," mailed in related U.S. Appl. No. 11/321,953 on Jun. 14, 2007, 15 pages.

USPTO, "Notice of Allowance and Fee(s) Due," mailed in related U.S. Appl. No. 11/321,681 on Jun. 29, 2007, 18 pages.

"Communication Relating to the Results of the Partial International Search" in PCT/US03/29603, EPO International Searching Authority, Jul. 30, 2004, 2 pages.

Eitan et al., "NROM: A Novel Localized Trapping, 2-Bit Nonvolatile Memory Cell," IEEE Electron Device Letters, vol. 21, No. 11, Nov. 2000, pp. 543-545.

EPO/ISA, "Notification of Transmittal of the International Search Report and the Written Opinion of the International Searching Authority, or the Declaration," mailed in related PCT/US2005/042854 on Apr. 20, 2006, 9 pages.

EPO/ISA, "Notification of Transmittal of the International Search Report or the Declaration", mailed in PCT/US03/29045, Jul. 28, 2004, 6 pages.

EPO/ISA, "Notification of Transmittal of the International Search Report or the Declaration", mailed in PCT/US03/29603 Nov. 5, 2004, 7 pages.

European Patent Office/International Searching Authority, "Notification of Transmittal of the International Preliminary Examination Report," mailed in related International Application No. PCT/US2004/029426 on Jun. 2, 2006, 8 pages.

International Search Report corresponding to PCT/US03/30133, International Searching Authority, European Patent Office, filed Feb. 16, 2004, 4 pages.

EPO/ISA, "Notification of Transmittal of the International Search Report and the Written Opinion of the International Searching Authority, or the Declaration", mailed in related PCT/US2004/029426 on Jan. 20, 2005, 12 pages.

USPTO, "Notice of Allowance and Fee(s) Due," mailed in related U.S. Appl. No. 11/015,199 on Dec. 20, 2005, 11 pages.

USPTO, "Notice of Allowance and Fee(s) Due," mailed in related U.S. Appl. No. 10/667,222 on Dec. 30, 2005, 8 pages.

USPTO, "Office Action," mailed in related U.S. Appl. No. 10/678,918 on Jan. 11, 2006, 10 pages.

USPTO, "Office Action," mailed in related U.S. Appl. No. 10/254,898 on Apr. 14, 2006, 13 pages.

USPTO, "Office Action," mailed in related U.S. Appl. No. 11/235,985 on May 9, 2006, 10 pages.

European Patent Office, "Office Action," mailed in European Patent Application No. 04 783 607.7 on Oct. 10, 2006, 1 page.

European Patent Office, "Office Action," mailed in European Patent Application No. 03 754 785.8 on Jul. 2, 2007, 4 pages.

EPO/ISA, "Notification of Transmittal of the International Search Report and the Written Opinion of the International Searching Authority, or the Declaration", mailed in corresponding PCT/US2006/062429 on Aug. 7, 2007, 14 pages.

USPTO, "Office Action," mailed in related U.S. Appl. No. 11/383,247 on Aug. 27, 2007, 14 pages.

USPTO, "Notice of Allowance and Fee(s) Due," mailed in related U.S. Appl. No. 11/321,681 on Sep. 6, 2007, 11 pages.

USPTO, "Notice of Allowance and Fee(s) Due," mailed in related U.S. Appl. No. 11/321,953 on Sep. 6, 2007, 10 pages.

USPTO, "Office Action," mailed in related U.S. Appl. No. 11/621,750 on Sep. 11, 2007, 8 pages.

EPO, "European Search Report," corresponding European Patent Application No. 05 07 7014, mailed on Jun. 27, 2008, 4 pages.

JPO, "Notification of Reasons for Refusal," corresponding in related Japanese Application No. 2004-540129, mailed on Apr. 8, 2008, 7 pages.

Taiwanese Patent Office, "Office Action and Taiwan IPO Search Report," corresponding Taiwanese Patent Application No. 92126361, mailed on Jan. 13, 2009, 4 pages (translation only.).

EPO, "European Search Report," corresponding European Patent Application No. 05 848 157.3, mailed on Aug. 20, 2008, 3 pages.

USPTO, "Notice of Allowance and Fee(s) Due," mailed in related U.S. Appl. No. 12/020,449 on Nov. 3, 2008, 16 pages.

China State Intellectual Property Office, "Office Action," corresponding Chinese Patent Application No. 03824864.6, mailed on Oct. 24, 2008, 9 pages (including translation.).

Japanese Patent Office, "Office Action," corresponding Japanese Patent Application No. 2007-546699, maile don Dec. 2, 2008, 5 pages (including translation.).

Japanese Patent Office, "Final Notification of Reasons for Refusal," corresponding Japanese Patent Application No. 2004-540129, mailed on Apr. 7, 2009, 4 pages (including translation.).

* cited by examiner

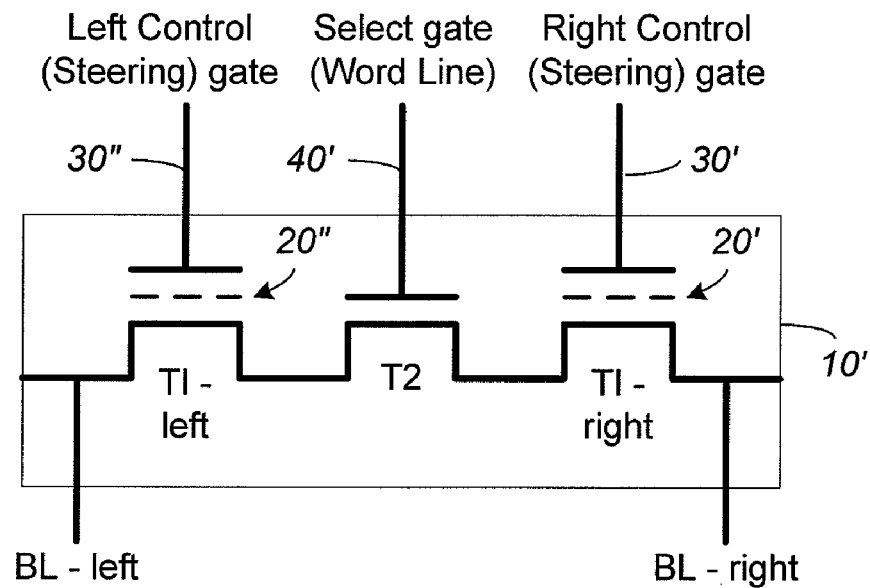
FIG. 1C *(Prior Art)*
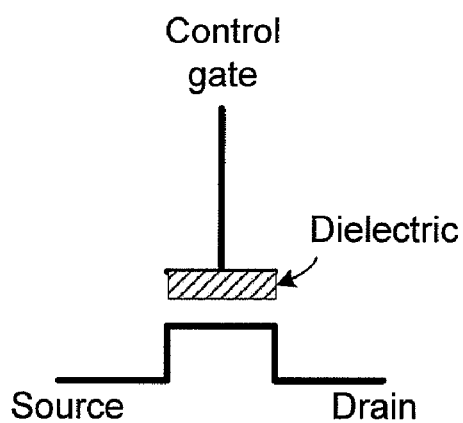
FIG. 1E *(Prior Art)*

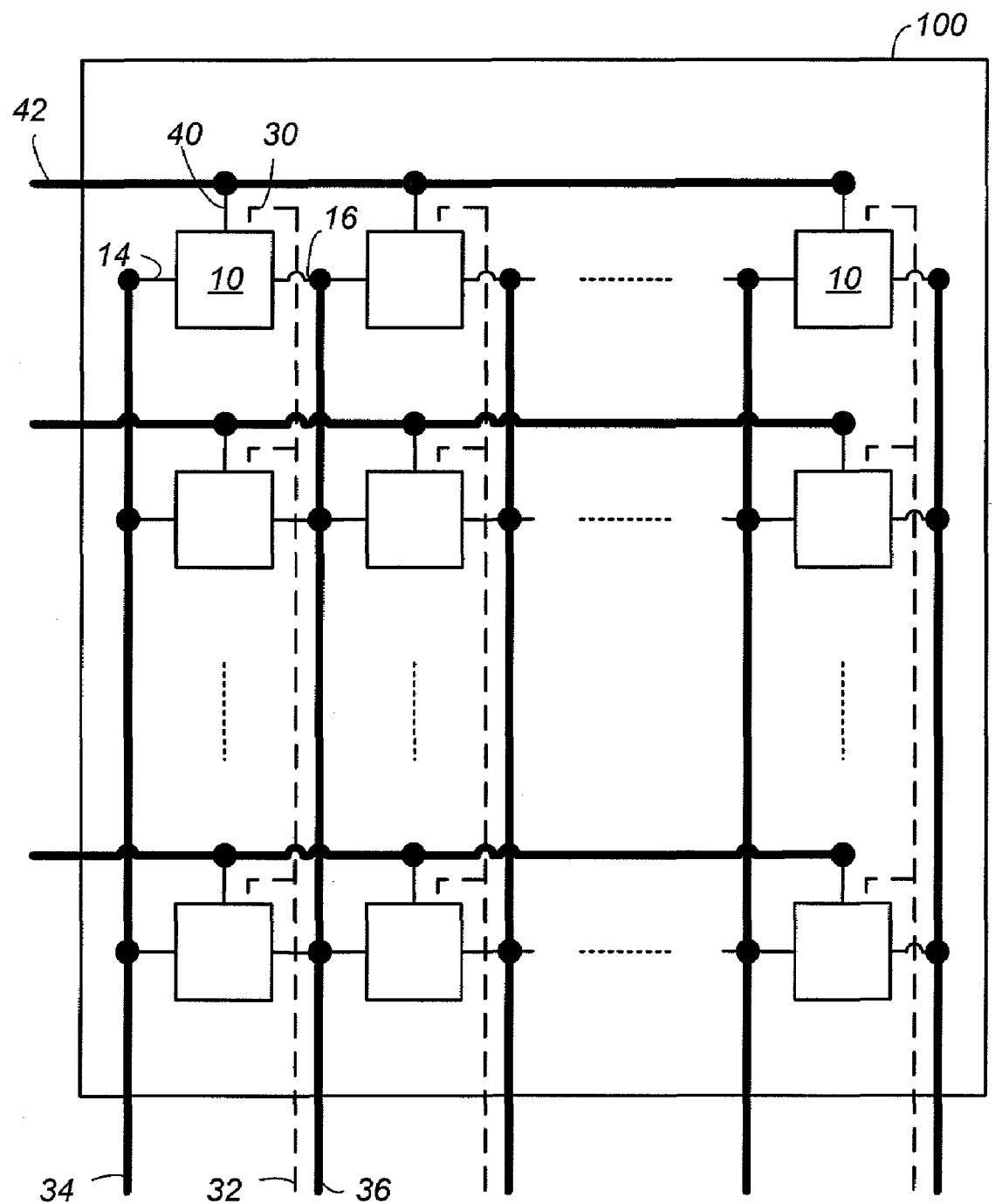
FIG. 2 *(Prior Art)*

FIG. 4  *(Prior Art)*

$i_{CELL} = i_{BL0} + [i_{BLC00} + i_{BLC01} + i_{BLC02}$
$+ i_{BLC03} + i_{BLC04}]$

NON-VOLATILE MEMORY AND METHOD WITH REDUCED SOURCE LINE BIAS ERRORS

CROSS REFERENCE TO RELATED APPLICATION

This application is a continuation of application Ser. No. 10/254,830, filed on Sep.24, 2002, now U.S. Pat. No. 7,196,931, which applications are incorporated herein in their entirety by this reference.

FIELD OF THE INVENTION

This invention relates generally to non-volatile semiconductor memory such as electrically erasable programmable read-only memory (EEPROM) and flash EEPROM, and specifically ones having improved sensing circuits.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, retaining its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

EXAMPLES OF NON-VOLATILE MEMORY CELLS

The memory devices typically comprise one or more memory chips that may be mounted on a card. Each memory chip comprises an array of memory cells supported by peripheral circuits such as decoders and erase, write and read circuits. The more sophisticated memory devices also come with a controller that performs intelligent and higher level memory operations and interfacing. There are many commercially successful non-volatile solid-state memory devices being used today. These memory devices may employ different types of memory cells, each type having one or more charge storage element.

FIGS. 1A-1E illustrate schematically different examples of non-volatile memory cells.

FIG. 1A illustrates schematically a non-volatile memory in the form of an EEPROM cell with a floating gate for storing charge. An electrically erasable and programmable read-only memory (EEPROM) has a similar structure to EPROM, but additionally provides a mechanism for loading and removing charge electrically from its floating gate upon application of proper voltages without the need for exposure to UV radiation. Examples of such cells and methods of manufacturing them are given in U.S. Pat. No. 5,595,924.

FIG. 1B illustrates schematically a flash EEPROM cell having both a select gate and a control or steering gate. The memory cell 10 has a "split-channel" 12 between source 14 and drain 16 diffusions. A cell is formed effectively with two transistors T1 and T2 in series. T1 serves as a memory transistor having a floating gate 20 and a control gate 30. The floating gate is capable of storing a selectable amount of charge. The amount of current that can flow through the T1's portion of the channel depends on the voltage on the control gate 30 and the amount of charge residing on the intervening floating gate 20. T2 serves as a select transistor having a select gate 40. When T2 is turned on by a voltage at the select gate 40, it allows the current in the T1's portion of the channel to pass between the source and drain. The select transistor provides a switch along the source-drain channel independent of the voltage at the control gate. One advantage is that it can be used to turn off those cells that are still conducting at zero control gate voltage due to their charge depletion (positive) at their floating gates. The other advantage is that it allows source side injection programming to be more easily implemented.

One simple embodiment of the split-channel memory cell is where the select gate and the control gate are connected to the same word line as indicated schematically by a dotted line shown in FIG. 1B. This is accomplished by having a charge storage element (floating gate) positioned over one portion of the channel and a control gate structure (which is part of a word line) positioned over the other channel portion as well as over the charge storage element. This effectively forms a cell with two transistors in series, one (the memory transistor) with a combination of the amount of charge on the charge storage element and the voltage on the word line controlling the amount of current that can flow through its portion of the channel, and the other (the select transistor) having the word line alone serving as its gate. Examples of such cells, their uses in memory systems and methods of manufacturing them are given in U.S. Pat. Nos. 5,070,032, 5,095,344, 5,315,541, 5,343,063, and 5,661,053.

A more refined embodiment of the split-channel cell shown in FIG. 1B is when the select gate and the control gate are independent and not connected by the dotted line between them. One implementation has the control gates of one column in an array of cells connected to a control (or steering) line perpendicular to the word line. The effect is to relieve the word line from having to perform two functions at the same time when reading or programming a selected cell. Those two functions are (1) to serve as a gate of a select transistor, thus requiring a proper voltage to turn the select transistor on and off, and (2) to drive the voltage of the charge storage element to a desired level through an electric field (capacitive) coupling between the word line and the charge storage element. It is often difficult to perform both of these functions in an optimum manner with a single voltage. With the separate control of the control gate and the select gate, the word line need only perform function (1), while the added control line performs function (2). This capability allows for design of higher performance programming where the programming voltage is geared to the targeted data. The use of independent control (or steering) gates in a flash EEPROM array is described, for example, in U.S. Pat. Nos. 5,313,421 and 6,222,762.

FIG. 1C illustrates schematically another flash EEPROM cell having dual floating gates and independent select and control gates. The memory cell 10 is similar to that of FIG. 1B except it effectively has three transistors in series. In this type of cell, two storage elements (i.e., that of T1-left and T1-right) are included over its channel between source and drain diffusions with a select transistor T1 in between them. The memory transistors have floating gates 20 and 20', and control gates 30 and 30', respectively. The select transistor T2 is controlled by a select gate 40. At any one time, only one of the pair of memory transistors is accessed for read or write. When the storage unit T1-left is being accessed, both the T2 and T1-right are turned on to allow the current in the T1-left's portion of the channel to pass between the source and the drain. Similarly, when the storage unit T1-right is being accessed, T2 and T1-left are turned on. Erase is effected by having a portion of the select gate polysilicon in close proximity to the floating gate and applying a substantial positive voltage (e.g. 20 V) to the select gate so that the electrons stored within the floating gate can tunnel to the select gate polysilicon.

FIG. 1D illustrates schematically a string of memory cells organized into a NAND cell. An NAND cell 50 consists of a series of memory transistors M1, M2, . . . Mn (n−4, 8, 16 or higher) daisy-chained by their sources and drains. A pair of select transistors S1, S2 controls the memory transistors chain's connection to the external via the NAND cell's source terminal 54 and drain terminal 56. In a memory array, when the source select transistor S1 is turned on, the source terminal is coupled to a source line. Similarly, when the drain select transistor S2 is turned on, the drain terminal of the NAND cell is coupled to a bit line of the memory array. Each memory transistor in the chain has a charge storage element to store a given amount of charge so as to represent an intended memory state. A control gate of each memory transistor provides control over read and write operations. A control gate of each of the select transistors S1, S2 provides control access to the NAND cell via its source terminal 54 and drain terminal 56 respectively.

When an addressed memory transistor within a NAND cell is read and verified during programming, its control gate is supplied with an appropriate voltage. At the same time, the rest of the non-addressed memory transistors in the NAND cell 50 are fully turned on by application of sufficient voltage on their control gates. In this way, a conductive path is effective created from the source of the individual memory transistor to the source terminal 54 of the NAND cell and likewise for the drain of the individual memory transistor to the drain terminal 56 of the cell. Memory devices with such NAND cell structures are described in U.S. Pat. Nos. 5,570,315, 5,903, 495, 6,046,935."

FIG. 1E illustrates schematically a non-volatile memory with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

Memory Array

A memory device typically comprises of a two-dimensional array of memory cells arranged in rows and columns and addressable by word lines and bit lines. The array can be formed according to an NOR type or an NAND type architecture.

NOR Array

FIG. 2 illustrates an example of an NOR array of memory cells. Memory devices with an NOR type architecture have been implemented with cells of the type illustrated in FIG. 1B or 1C. Each row of memory cells are connected by their sources and drains in a daisy-chain manner. This design is sometimes referred to as a virtual ground design. Each memory cell 10 has a source 14, a drain 16, a control gate 30 and a select gate 40. The cells in a row have their select gates connected to word line 42. The cells in a column have their sources and drains respectively connected to selected bit lines 34 and 36. In some embodiments where the memory cells have their control gate and select gate controlled independently, a steering line 36 also connects the control gates of the cells in a column.

Many flash EEPROM devices are implemented with memory cells where each is formed with its control gate and select gate connected together. In this case, there is no need for steering lines and a word line simply connects all the control gates and select gates of cells along each row. Examples of these designs are disclosed in U.S. Pat. Nos. 5,172,338 and 5,418,752. In these designs, the word line essentially performed two functions: row selection and supplying control gate voltage to all cells in the row for reading or programming.

NAND Array

FIG. 3 illustrates an example of an NAND array of memory cells, such as that shown in FIG. 1D. Along each column of NAND cells, a bit line is coupled to the drain terminal 56 of each NAND cell. Along each row of NAND cells, a source line may connect all their source terminals 54. Also the control gates of the NAND cells along a row are connected to a series of corresponding word lines. An entire row of NAND cells can be addressed by turning on the pair of select transistors (see FIG. 1D) with appropriate voltages on their control gates via the connected word lines. When a memory transistor within the chain of a NAND cell is being read, the remaining memory transistors in the chain are turned on hard via their associated word lines so that the current flowing through the chain is essentially dependent upon the level of charge stored in the cell being read. An example of an NAND architecture array and its operation as part of a memory system is found in U.S. Pat. Nos. 5,570,315, 5,774,397 and 6,046,935.

Block Erase

Programming of charge storage memory devices can only result in adding more charge to its charge storage elements. Therefore, prior to a program operation, existing charge in a charge storage element must be removed (or erased). Erase circuits (not shown) are provided to erase one or more blocks of memory cells. A non-volatile memory such as EEPROM is referred to as a "Flash" EEPROM when an entire array of cells, or significant groups of cells of the array, is electrically erased together (i.e., in a flash). Once erased, the group of cells can then be reprogrammed. The group of cells erasable together may consist one or more addressable erase unit. The erase unit or block typically stores one or more pages of data, the page being the unit of programming and reading, although more than one page may be programmed or read in a single operation. Each page typically stores one or more sectors of data, the size of the sector being defined by the host system. An example is a sector of 512 bytes of user data, following a standard established with magnetic disk drives, plus some number of bytes of overhead information about the user data and/or the block in with it is stored.

Read/Write Circuits

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current $I_{REF}$). If the current read is higher than that of the breakpoint level or $I_{REF}$, the cell is determined to be in one logical state (e.g., a "zero" state. On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

FIG. 4 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Six memory states may be demarcated by partitioning the threshold window into five regions in interval of 0.5V each. For example, if a reference current, $I_{REF}$ of 2 µA is used as shown, then the cell programmed with Q1 may be considered to be in a memory state "1" since its curve intersects with IREF in the region of the threshold window demarcated by $V_{CG}$=0.5V and 1.0V. Similarly, Q4 is in a memory state "5".

As can be seen from the description above, the more states a memory cell is made to store, the more finely divided is its threshold window. This will require higher precision in programming and reading operations in order to be able to achieve the required resolution.

U.S. Pat. No. 4,357,685 discloses a method of programming a 2-state EPROM in which when a cell is programmed to a given state, it is subject to successive programming voltage pulses, each time adding incremental charge to the floating gate. In between pulses, the cell is read back or verified to determine its source-drain current relative to the breakpoint level. Programming stops when the current state has been verified to reach the desired state. The programming pulse train used may have increasing period or amplitude.

Prior art programming circuits simply apply programming pulses to step through the threshold window from the erased or ground state until the target state is reached. Practically, to allow for adequate resolution, each partitioned or demarcated region would require at least about five programming steps to transverse. The performance is acceptable for 2-state memory cells. However, for multi-state cells, the number of steps required increases with the number of partitions and therefore, the programming precision or resolution must be increased. For example, a 16-state cell may require on average at least 40 programming pulses to program to a target state.

FIG. 5 illustrates schematically a memory device with a typical arrangement of a memory array 100 accessible by read/write circuits 170 via row decoder 130 and column decoder 160. As described in connection with FIGS. 2 and 3, a memory transistor of a memory cell in the memory array 100 is addressable via a set of selected word line(s) and bit line(s). The row decoder 130 selects one or more word lines and the column decoder 160 selects one or more bit lines in order to apply appropriate voltages to the respective gates of the addressed memory transistor. Read/write circuits 170 are provided to read or write (program) the memory states of addressed memory transistors. The read/write circuits 170 comprise a number of read/write modules connectable via bit lines to the memory elements in the array.

Factors Affecting Read/Write Performance and Accuracy

In order to improve read and program performance, multiple charge storage elements or memory transistors in an array are read or programmed in parallel. Thus, a logical "page" of memory elements are read or programmed together. In existing memory architectures, a row typically contains several interleaved pages. All memory elements of a page will be read or programmed together. The column decoder will selectively connect each one of the interleaved pages to a corresponding number of read/write modules. For example, in one implementation, the memory array is designed to have a page size of 532 bytes (512 bytes plus 20 bytes of overheads.) If each column contains a drain bit line and there are two interleaved pages per row, this amounts to 8512 columns with each page being associated with 4256 columns. There will be 4256 sense modules connectable to read or write in parallel either all the even bit lines or the odd bit lines. In this way, a page of 4256 bits (i.e., 532 bytes) of data in parallel are read from or programmed into the page of memory elements. The read/write modules forming the read/write circuits 170 can be arranged into various architectures.

As mentioned before, conventional memory devices improve read/write operations by operating in a massively parallel manner. This approach improves performances but also has repercussions on the accuracy of read and write operations.

One issue is the source line bias error. This is particular acute for memory architecture where a large number memory cells have their sources tie together in a source line to ground. Parallel sensing of these memory cells with common source results in a substantial current through the source line. Owing to finite resistance in the source line, this in turn results in an appreciable potential difference between the true ground and the source electrode of each memory cell. During sensing, the threshold voltage supplied to the control gate of each memory cell is relative to its source electrode but the system power supply is relative to the true ground. Thus sensing may become inaccurate due to the existence of the source line bias error.

Another issue has to do with bit line to bit line coupling or crosstalk. This problem becomes more acute with parallel sensing of closely spaced bit lines. A conventional solution to avoid bit line to bit line crosstalk is to sense either all even or all odd bit lines at a time while grounding the other bit lines. This architecture of a row consisting of two interleaved pages will help to avoid bit line crosstalk as well as to alleviate the problem of densely fitting the page of read/write circuits. A page decoder is used to multiplex the set of read/write modules to either the even page or the odd page. In this way, whenever one set of bit lines are being read or programmed, the interleaving set can be grounded to eliminate crosstalk between odd and even bit lines, but not between odd lines or even lines.

However, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in addressing other disturb effects such as field coupling between neighboring charge storage elements at the floating gate level when the two neighbors are programmed at different times, such as separately in odd and even pages.

The problem of neighboring field coupling becomes more pronounced with ever closer spacing between memory transistors. In a memory transistor, a charge storage element is sandwiched between a channel region and a control gate. The current that flows in the channel region is a function of the resultant electric field contributed by the field at the control gate and the charge storage element. With ever increasing density, memory transistors are formed closer and closer together. The field from neighboring charge elements then becomes significant contributor to the resultant field of an affected cell. The neighboring field depends on the charge programmed into the charge storage elements of the neighbors. This perturbing field is dynamic in nature as it changes with the programmed states of the neighbors. Thus, an affected cell may read differently at different time depending on the changing states of the neighbors.

The conventional architecture of interleaving page exacerbates the error caused by neighboring floating gate coupling. Since the even page and the odd page are programmed and read independently of each other, a page may be programmed under one set of condition but read back under an entirely different set of condition, depending on what has happened to the intervening page in the meantime. The read errors will become more severe with increasing density, requiring a more accurate read operation and coarser partitioning of the threshold window for multi-state implementation. Performance will suffer and the potential capacity in a multi-state implementation is limited.

Therefore there is a general need for high performance and high capacity non-volatile memory. In particular, there is a need to have a high capacity non-volatile memory with improved read and program performance that effectively manages the aforementioned problems.

SUMMARY OF INVENTION

These needs for a high capacity and high performance non-volatile memory device are met by having a large page of read/write circuits to read and write a corresponding page of memory cells in parallel. In particular, disturbance effects inherent in high density chip integration are that may introduce errors into reading and programming are either eliminated or minimized.

Source line bias is an error introduced by a non-zero resistance in the ground loop of the read/write circuits. The error is caused by a voltage drop across the resistance when current flows. According to one aspect of the invention, a method for reducing source line bias is accomplished by read/write circuits with features and techniques for multi-pass sensing. When a page of memory cells are being sensed in parallel, each pass helps to identify and shut down the memory cells with conduction current higher than a given demarcation current value. The identified memory cells are shut down by pulling their associated bit lines to ground.

In one implementation, the given demarcation current value is higher than the breakpoint current value for a conventional single-pass sensing. Alternatively, the given demarcation current value progressively converges to the breakpoint current value for a convention single pass sensing. In this way, sensing in subsequent passes will be less affected by source line bias since the total amount of current flow is significantly reduced by eliminating the contributions from the higher current cells.

According to one preferred embodiment, the current states are identified in a first pass by comparing each of their conduction currents with the given demarcation current value.

According to another preferred embodiment, the higher current states are identified in first pass by precharging each bit line with a controlled current source. This is accomplished by a precharge circuit acting as a controlled current source with the supplied current limited to the demarcation current value. In this way, memory cells with conduction currents that exceed the demarcation current value will drain away the current faster than the precharge circuit can charge up their associated bit lines. Thus, these high current memory cells are identified because their bit lines failed to be charged up and are then eliminated from participating in subsequent passes.

According to yet another preferred embodiment, the higher current states are identified by multiple passes that include comparison with a given demarcation current value and controlled precharging.

Another error is caused by capacitive coupling between bit lines. According to another aspect of the present invention, a memory device and a method thereof allow sensing a plurality of memory cells in parallel while minimizing errors caused by bit-line to bit-line coupling or crosstalk. Essentially, the plurality of bit line being sensed in parallel has their bit line voltages controlled such that the voltage difference between each adjacent pair of bit lines is substantially independent of time while their conduction currents are being sensed. When this condition is imposed, all displacement currents due to the various bit lines' capacitance drop out since they all depend on a time varying voltage difference.

In a preferred embodiment this is accomplished by parallel sensing circuits that also ensures that the potential difference on any adjacent pair of connected bit lines is time-independent.

Prior art sensing includes determining the rate of the conduction current discharging the equivalent capacitor due to the bit line capacitance. This will contradict the present inventive feature of sensing at clamped bit line voltage.

According to another aspect of the present invention, a sensing circuit and method allow determination of a memory cell's conduction current by noting the rate it discharges or charges a given capacitor independent of the bit line. This will allow an optimum sensing circuit and method to be used, which are independent of the architecture of the memory array (i.e., independent of the bit line capacitance.) More importantly, it allows the bit line voltages to be clamped during sensing in order to avoid bit line crosstalk.

An error inherent in a non-volatile memory formed as a high density integrated circuit is due to coupling of the field from neighboring charge storage elements. Individual memory cells are not only affected by the field from their own storage element but also from that of neighboring cells. According to another aspect of the present invention, the errors due to the extraneous neighboring fields are minimized by minimizing the change in the field environment of each cell between programming and reading. This is accomplished by programming all adjacent memory cells in a page thereof together. Since the individual memory cells and their neighbors are programmed together, it will ensure a minimum change in field environment seen by the individual cells from the time they are programmed to the time they are read. In this way the error incurred during program verified is offset by a similar error during read, and the error is reduced and less data-dependent.

Additional features and advantages of the present invention will be understood from the following description of its preferred embodiments, which description should be taken in conjunction with the accompanying drawings.

BRIEF DESCRIPTION OF THE DRAWINGS

FIGS. 1A-1E illustrate schematically different examples of non-volatile memory cells.

FIG. 2 illustrates an example of an NOR array of memory cells.

DETAILED DESCRIPTION OF THE PREFERRED EMBODIMENTS

Figure 6A:
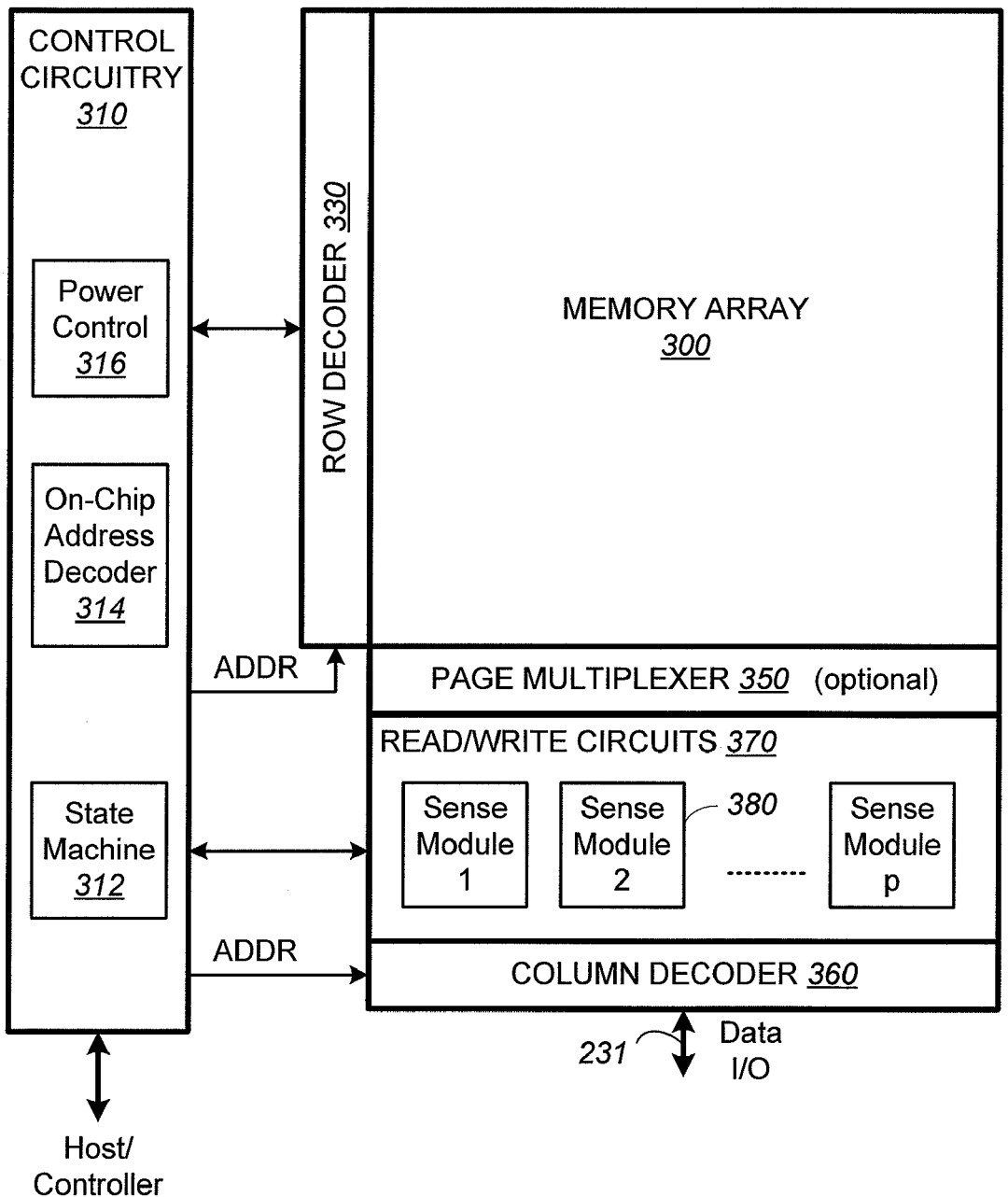
FIG. 6A illustrates schematically a memory device having read/write circuits for reading and programming a page of memory cells in parallel, according to one embodiment of the present invention.

FIG. 6A illustrates schematically a memory device having read/write circuits for reading and programming a page of memory cells in parallel, according to one embodiment of the present invention. The memory device includes a two-dimensional array of memory cells 300, control circuitry 310, and read/write circuits 370. The memory array 300 is addressable by word lines via a row decoder 330 and by bit lines via a column decoder 360. The read/write circuits 370 include multiple sense modules 380 and allows a page of memory cells to be read or programmed in parallel. In one embodiment, where a row of memory cells are partitioned into multiple pages, a page multiplexer 350 is provided to multiplex the read/write circuits 370 to the individual pages.

The control circuitry 310 cooperates with the read/write circuits 370 to perform memory operations on the memory array 300. The control circuitry 310 includes a state machine 312, an on-chip address decoder 314 and a power control module 316. The state machine 312 provides chip level control of memory operations. The on-chip address decoder 314 provides an address interface between that used by the host or a memory controller to the hardware address used by the decoders 330 and 370. The power control module 316 controls the power and voltages supplied to the word lines and bit lines during memory operations.

Figure 6B:
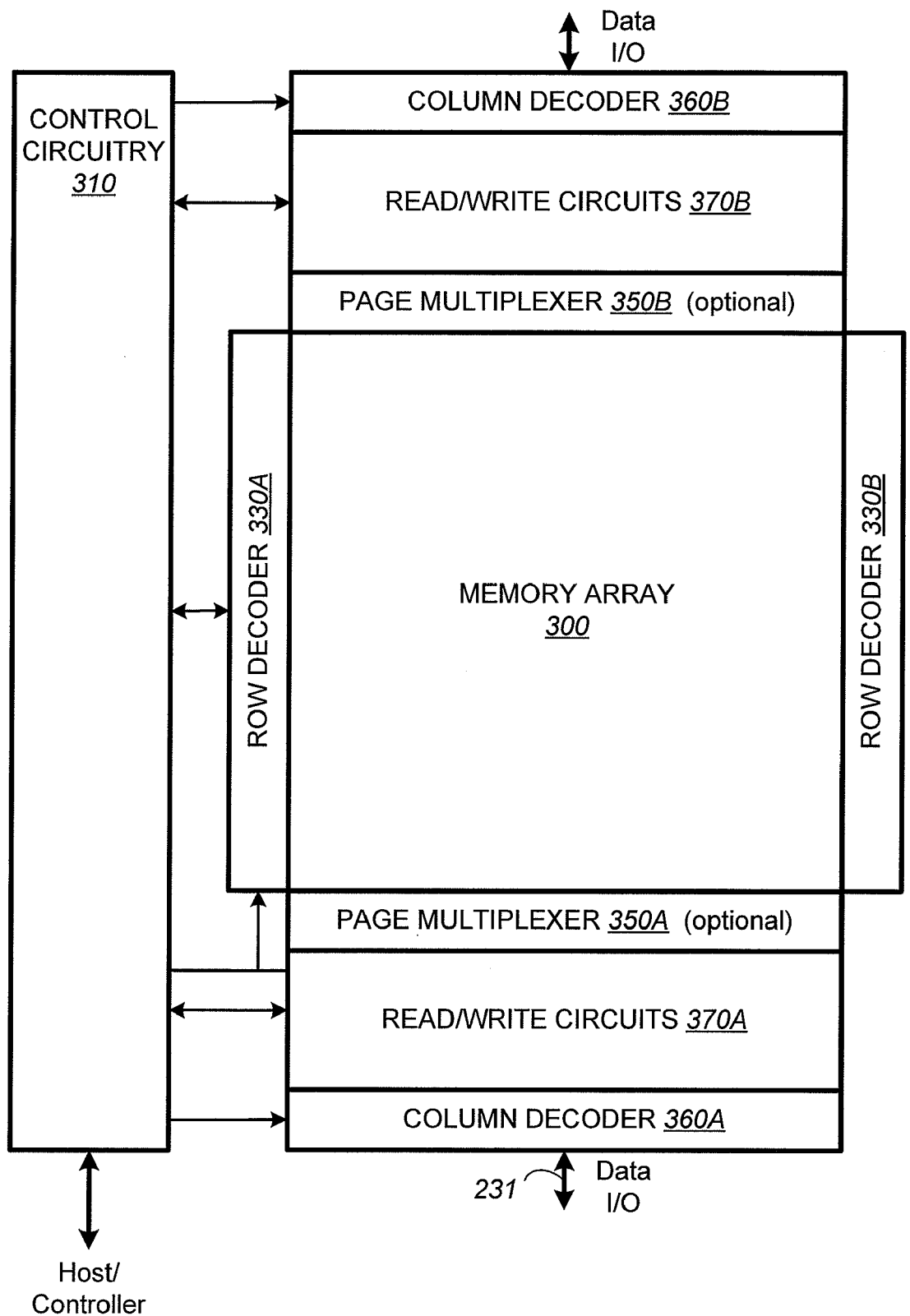
FIG. 6B illustrates a preferred arrangement of the memory device shown in FIG. 6A.

FIG. 6B illustrates a preferred arrangement of the compact memory device shown in FIG. 6A. Access to the memory array 300 by the various peripheral circuits is implemented in a symmetric fashion, on opposite sides of the array so that the densities of access lines and circuitry on each side are reduced in half. Thus, the row decoder is split into row decoders 330A and 330B and the column decoder into column decoders 360A and 360B. In the embodiment where a row of memory cells are partitioned into multiple pages, the page multiplexer 350 is split into page multiplexers 350A and 350B. Similarly, the read/write circuits are split into read/write circuits 370A connecting to bit lines from the bottom and read/write circuits 370B connecting to bit lines from the top of the array 300. In this way, the density of the read/write modules, and therefore that of the sense modules 380, is essentially reduced by one half.

Source Line Error Management

One potential problem with sensing memory cells is source line bias. When a large number memory cells are sensed in parallel, their combine currents can result in significant voltage drop in a ground loop with finite resistance. This results in a source line bias which causes error in a read operation employing threshold voltage sensing.

Figure 7A:
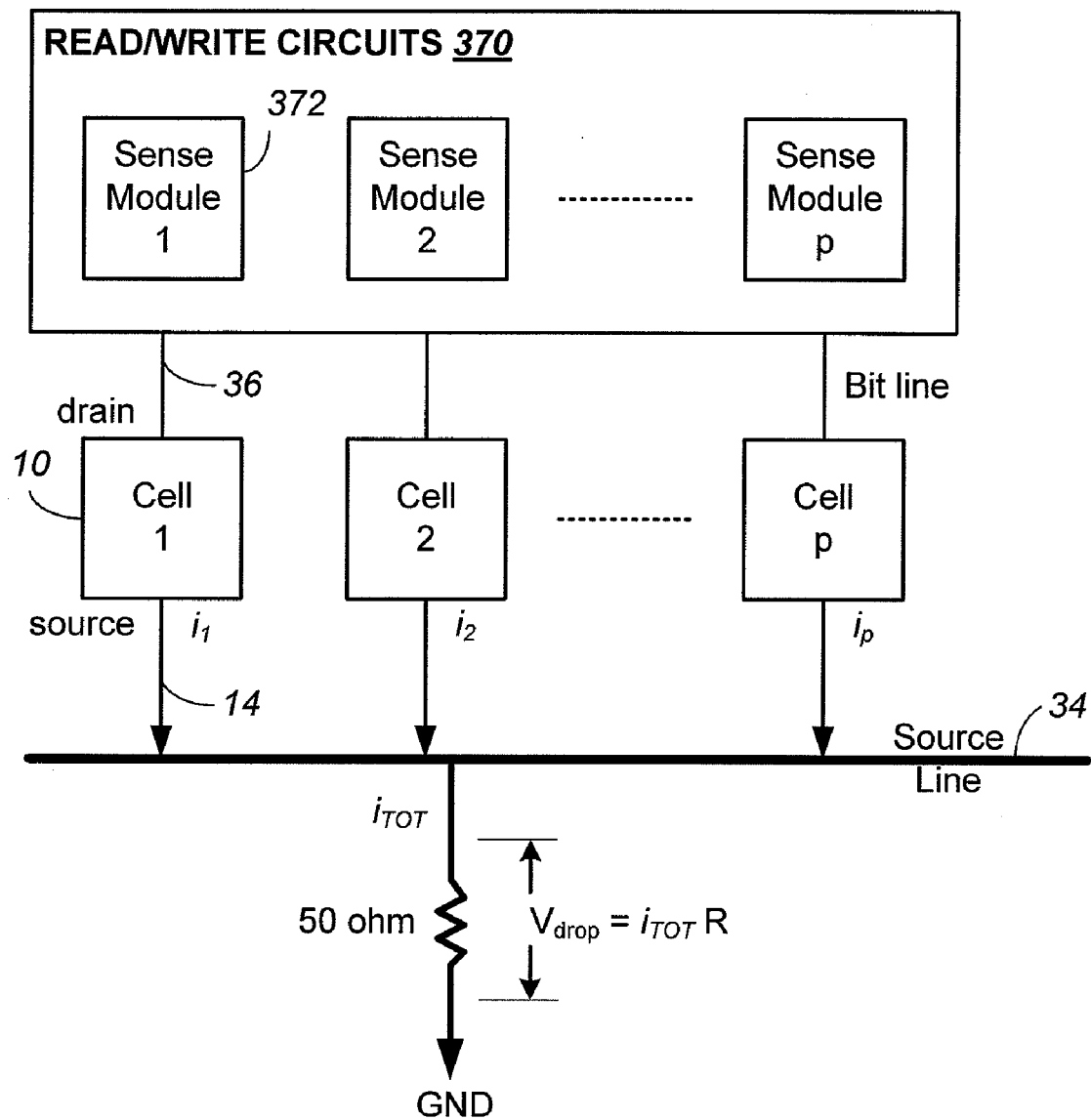
FIG. 7A illustrates the problem of source voltage error due to current flow in the source line having a finite resistance to ground.

FIG. 7A illustrates the problem of source voltage error due to current flow in the source line having a finite resistance to ground. The read/write circuits 370 operate on a page of memory cells simultaneously. Each sense modules 380 in the read/write circuits is coupled to a corresponding cell via a bit line 36. For example, a sense module 380 senses the conduction current $i_1$ (source-drain current) of a memory cell 10. The conduction current flows from the sense module through the bit line 36 into the drain of the memory cell 10 and out from the source 14 before going through a source line 34 to ground. In an integrated circuit chip, the sources of the cells in a memory array are all tied together as multiple branches of the source line 34 connected to some external ground pad (e.g. Vss pad) of the memory chip. Even when metal strappings are used to reduce the resistance of the source line, a finite resistance, R, remains between the source electrode of a memory cell and the ground pad. Typically, the ground loop resistance R is around 50 ohm.

Figure 1A:
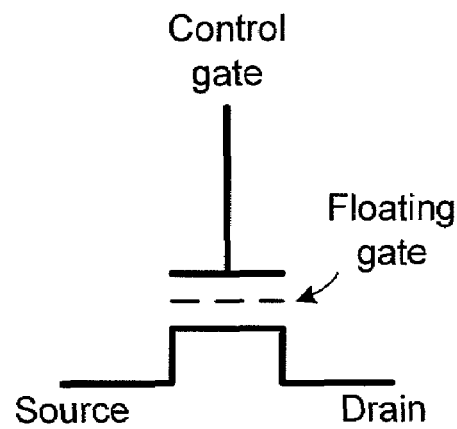
Figure 1B:
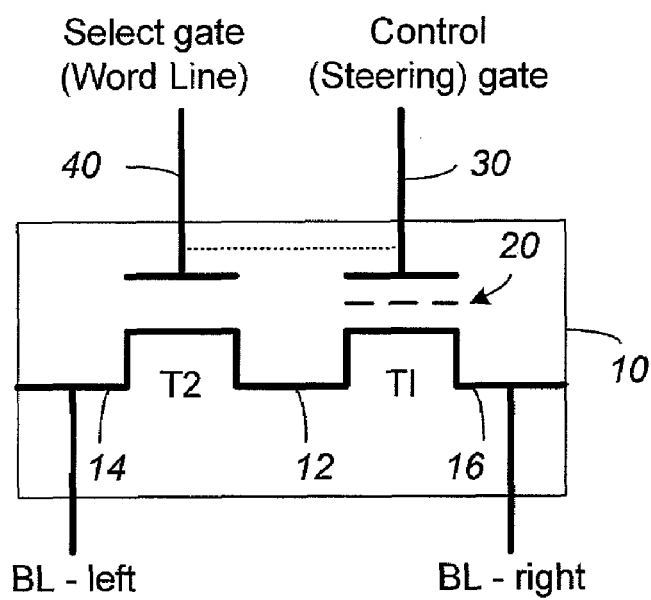
Figure 1D:
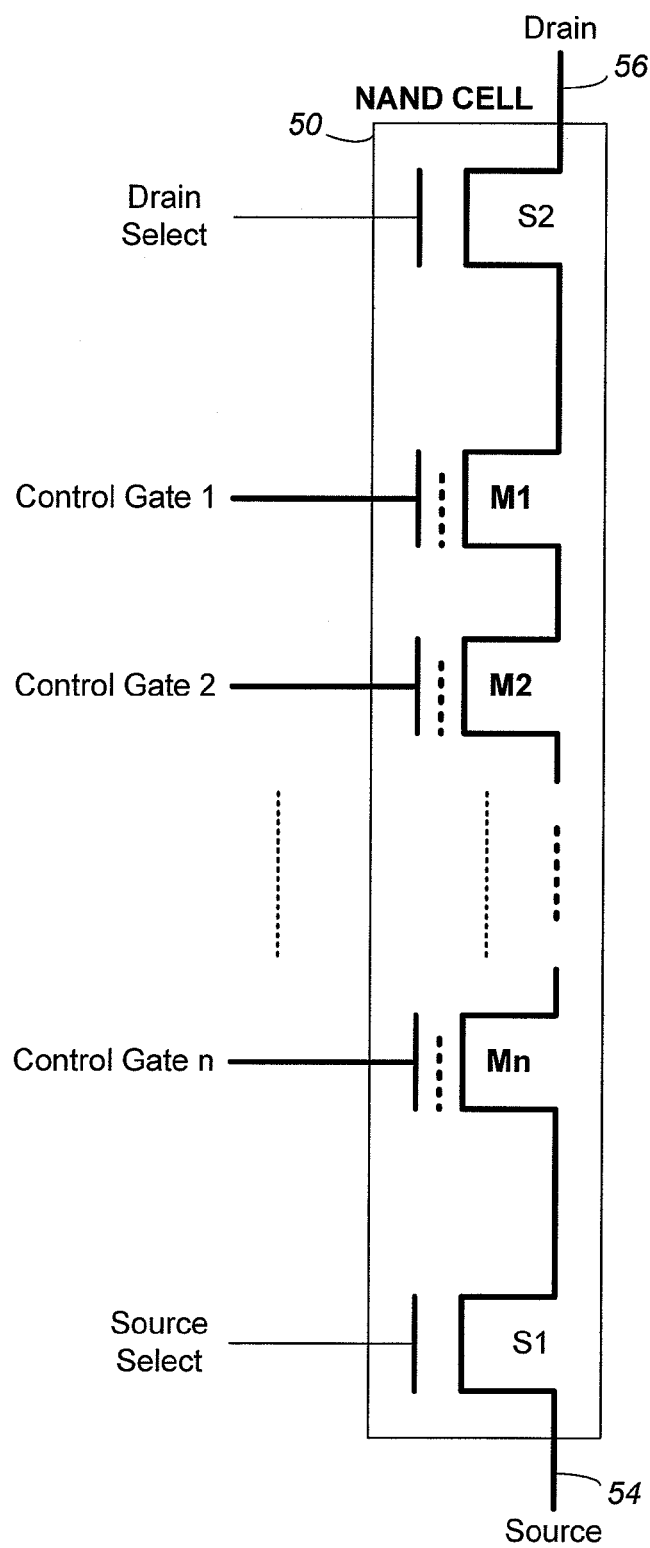
Figure 3:
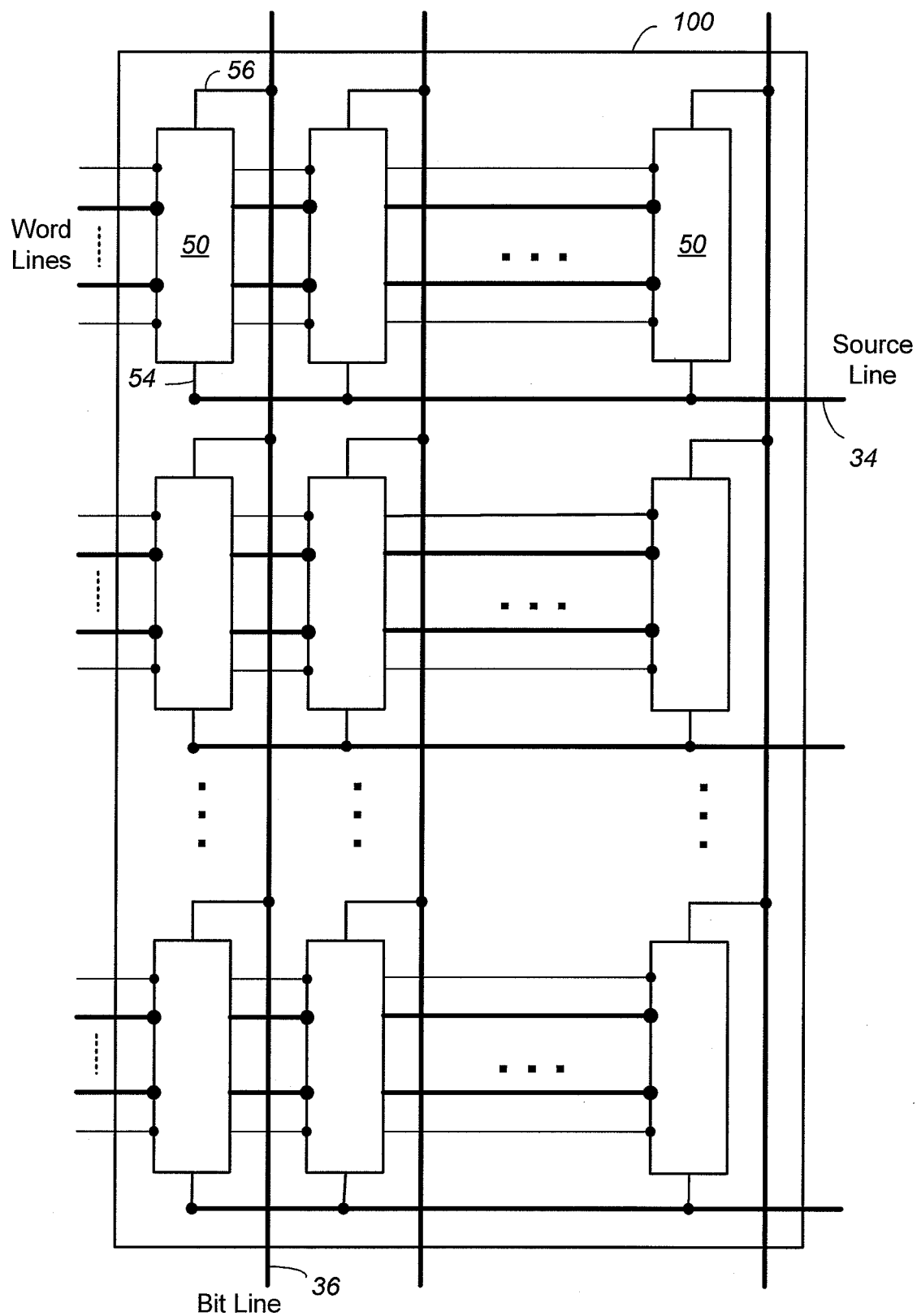
FIG. 3 illustrates an example of an NAND array of memory cells, such as that shown in FIG. 1D.
Figure 4:
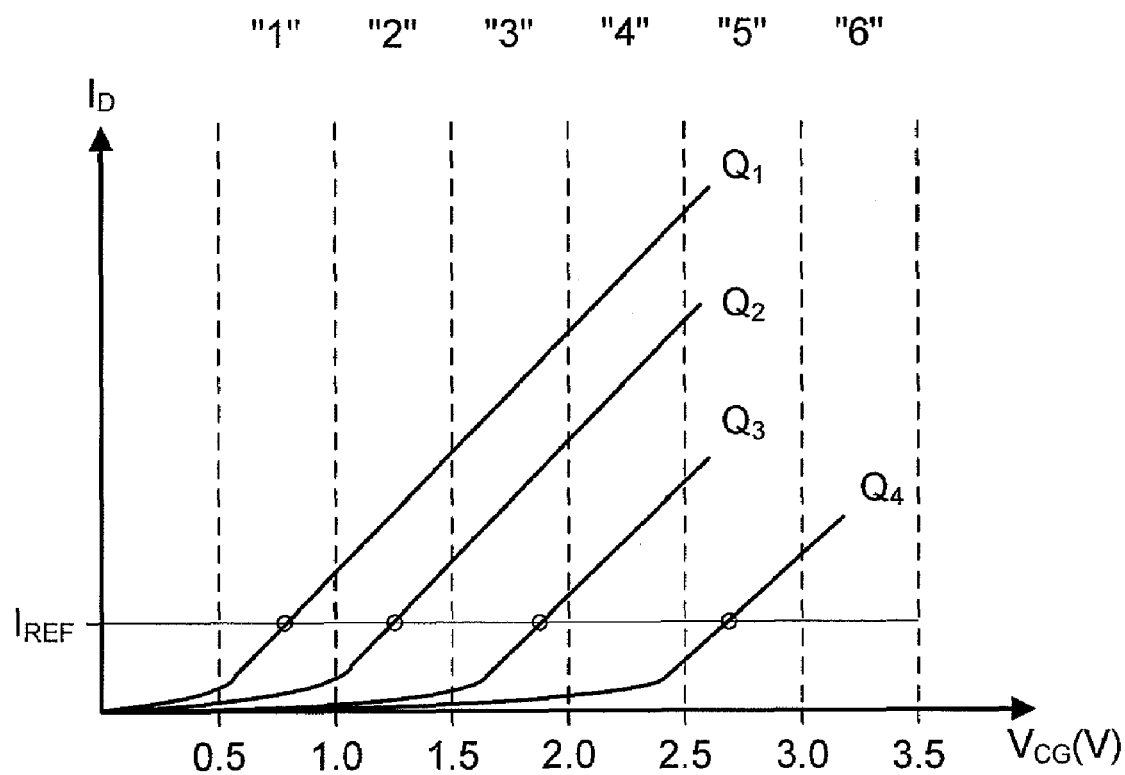
FIG. 4 illustrates the relation between the source-drain current and the control gate voltage for four different charges Q1-Q4 that the floating gate may be storing at any one time.
Figure 5:
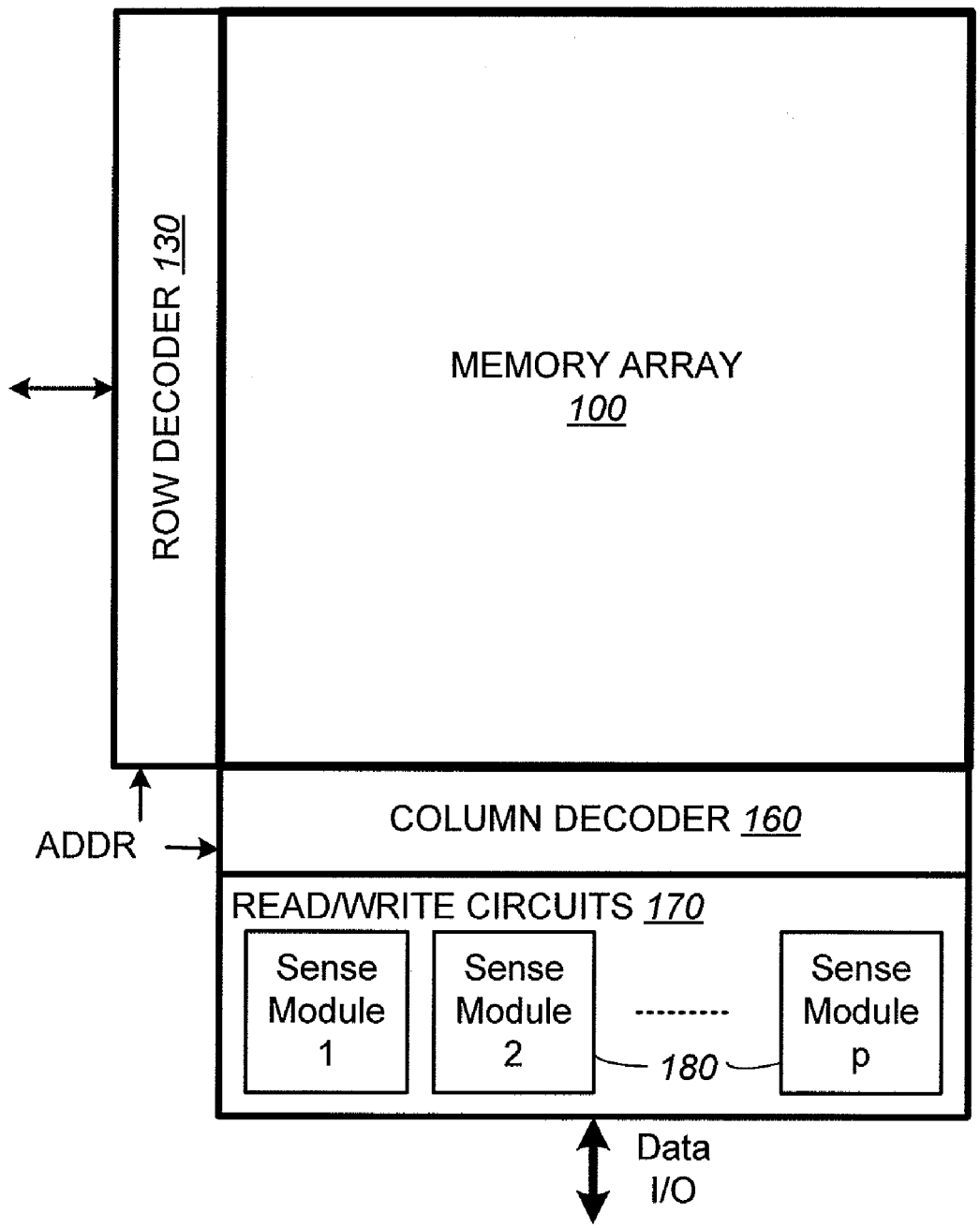
FIG. 5 illustrates schematically a typical arrangement of a memory array accessible by read/write circuits via row and column decoders.

For the entire page of memory being sensed in parallel, the total current flowing through the source line 34 is the sum of all the conduction currents, i.e. $i_{TOT}=i_1+i_2+\ldots,+i_p$. Generally each memory cell has a conduction current dependent on the amount of charge programmed into its charge storage element. For a given control gate voltage of the memory cell, a small charge will yield a comparatively higher conduction current (see FIG. 4.) When a finite resistance exists between the source electrode of a memory cell and the ground pad, the voltage drop across the resistance is given by $V_{drop}=i_{TOT}R$.

For example, if 4,256 bit lines discharge at the same time, each with a current of 1 µA, then the source line voltage drop will be equal to 4000 lines×1 µA/line×50 ohms~0.2 volts. This source line bias will contribute to a sensing error of 0.2 volts when threshold voltages of the memory cells are sensed.

Figure 7B:
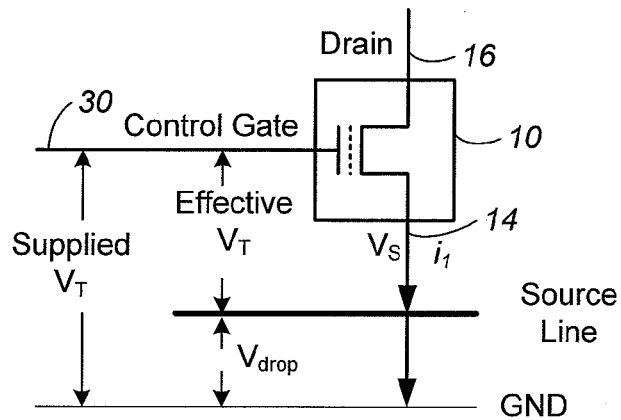
FIG. 7B illustrates the error in the threshold voltage level of a memory cell caused by a source line voltage drop.

FIG. 7B illustrates the error in the threshold voltage level of a memory cell caused by a source line voltage drop. The threshold voltage $V_T$ supplied to the control gate 30 of the memory cell 10 is relative to GND. However, the effective $V_T$ seen by the memory cell is the voltage difference between its control gate 30 and source 14. There is a difference of approximately $V_{drop}$ between the supplied and effective $V_T$ (ignoring the smaller contribution of voltage drop from the source 14 to the source line.) This $V_{drop}$ or source line bias will contribute to a sensing error of, for example 0.2 volts when threshold voltages of the memory cells are sensed. This bias cannot be easily removed as it is data-dependent, i.e., dependent on the memory states of the memory cells of the page.

According to one aspect of the invention, a method for reducing source line bias is accomplished by read/write circuits with features and techniques for multi-pass sensing. Each pass helps to identify and shut down the memory cells with conduction current higher than a given demarcation current value. Typically with each pass, the given demarcation current value progressively converges to the breakpoint current value for a convention single pass sensing. In this way, sensing in subsequent passes will be less affected by source line bias since the higher current cells have been shut down.

Figure 8:
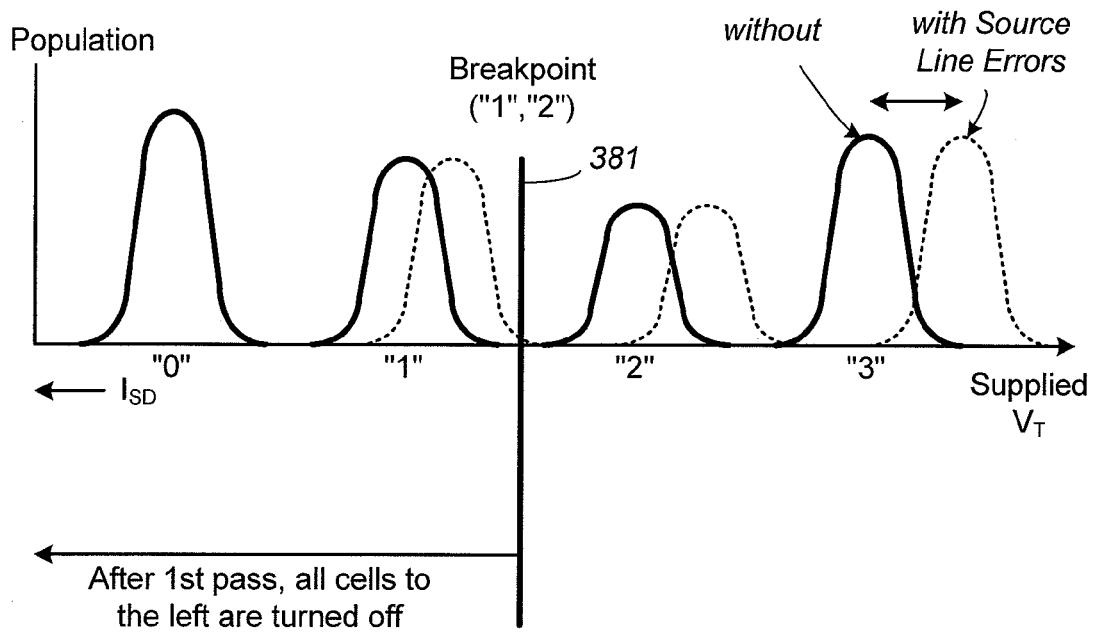
FIG. 8 illustrates an example population distribution of a page of memory cells for a 4-state memory.

FIG. 8 illustrates an example population distribution of a page of memory cells for a 4-state memory. Each cluster of memory state is programmed within a range of conduction currents $I_{SD}$ clearly separated from each other. For example, a breakpoint 381 is a demarcating current value between two clusters, respectively representing the "1" and "2" memory states. In a conventional single-pass sensing, a necessary condition for a "2" memory state will be that it has a conduction current less than the breakpoint 381. In FIG. 8, if there were no source line bias, the population distribution with respect to the supplied threshold voltage $V_T$ will be given by the curve with the solid line. However, because of the source line bias error, the threshold voltage of each of the memory cells at its control gate is increased by the source line bias. This means a higher control gate voltage need be applied to compensate for the bias. In FIG. 8, the source line bias results in a shifting of the distribution (broken line) towards a higher supplied $V_T$. The shifting will be more for that of the higher (lower current) memory states. If the breakpoint 381 is designed for the case without source line error, then the existence of a source line error will have some of the tail end of "1"

states having conduction currents to appear in a region of no conduction, which means higher than the breakpoint 381. This will result in some of the "1" states (more conducting) being mistakenly demarcated as "2" states (less conducting.)

For example, the present multi-pass sensing can be implement in two passes (j=1 to 2). After the first pass, those memory cells with conduction currents higher than the breakpoint 381 are identified and removed by turning off their conduction current. A preferred way to turn off their conduction currents is to set their drain voltages on the bit lines to ground. Referring also to FIG. 7A, this will effective remove all the higher current states demarcated by the breakpoint 381, resulting in a much reduced $i_{TOT}$ and therefore a much reduced $V_{drop}$. In a second pass (j=2), because of the removal of the high current states that contributed to the source line bias, the distribution with the broken line approaches that of the one with the solid line. Thus sensing using the breakpoint 381 as the demarcation current value will not result in mistaking the "1" states for the "2" states.

As compared to a conventional one-pass approach, the present two-pass method substantially reduces the likelihood of misidentifying some of the "1" cells as "2" or higher cells. More than two passes are also contemplated, although there will be diminishing returns with increasing number of passes. Further each pass may have the same demarcation current, or with each successive pass, the demarcation current used converges to that of a breakpoint normally used in a conventional single pass sensing.

Figure 9:
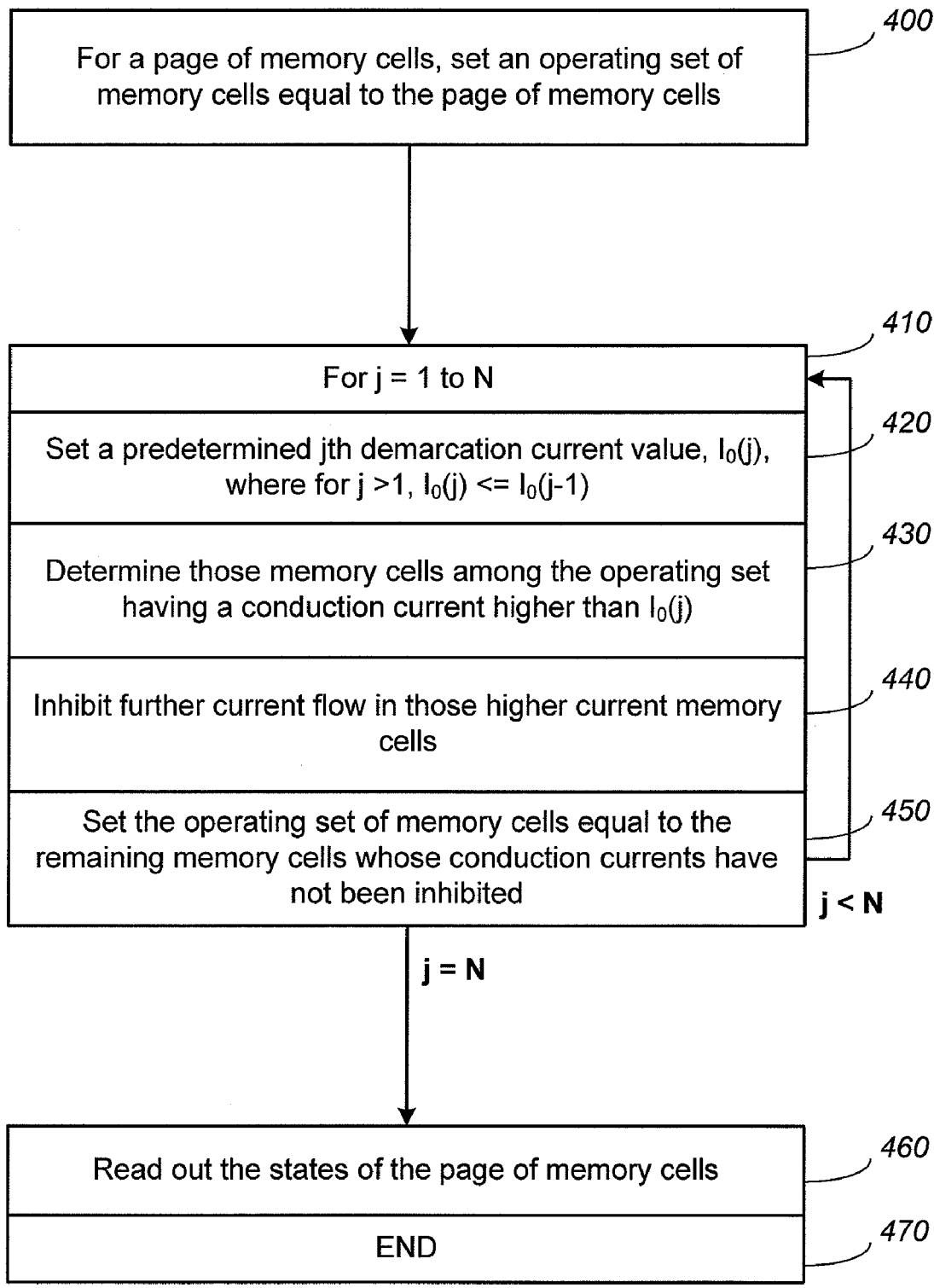
FIG. 9 is a flow diagram showing a multi-pass sensing method for reducing source line bias, according to one embodiment of the invention.

FIG. 9 is a flow diagram showing a multi-pass sensing method for reducing source line bias, according to one embodiment of the invention.

STEP 400: For a page of memory cells, initially set an operating set of memory cells equal to the page of memory cells.

STEP 410: Begin the multi-pass j=1 to N.

STEP 420: Set a demarcation current value, $I_0(j)$, where after the first pass j>1, $I_0(j)$ is less than or equal that of a previous pass j−1, i.e. $I_0(j)<=I_0(j-1)$.

STEP 430: Determine those memory cells among the operating set having a conduction current higher than the demarcation current value $I_0(j)$.

STEP 440: Inhibit further current flow in those memory cells with a conduction current higher than the demarcation current value $I_0(j)$.

STEP 450: Set the operating set of memory cells equal to the remaining memory cells whose conduction currents have not been inhibited. If j<N, return to STEP 410, otherwise proceed to STEP 460.

STEP 460: Read out the states of the page of memory cells.

STEP 470: End.

Figure 10:
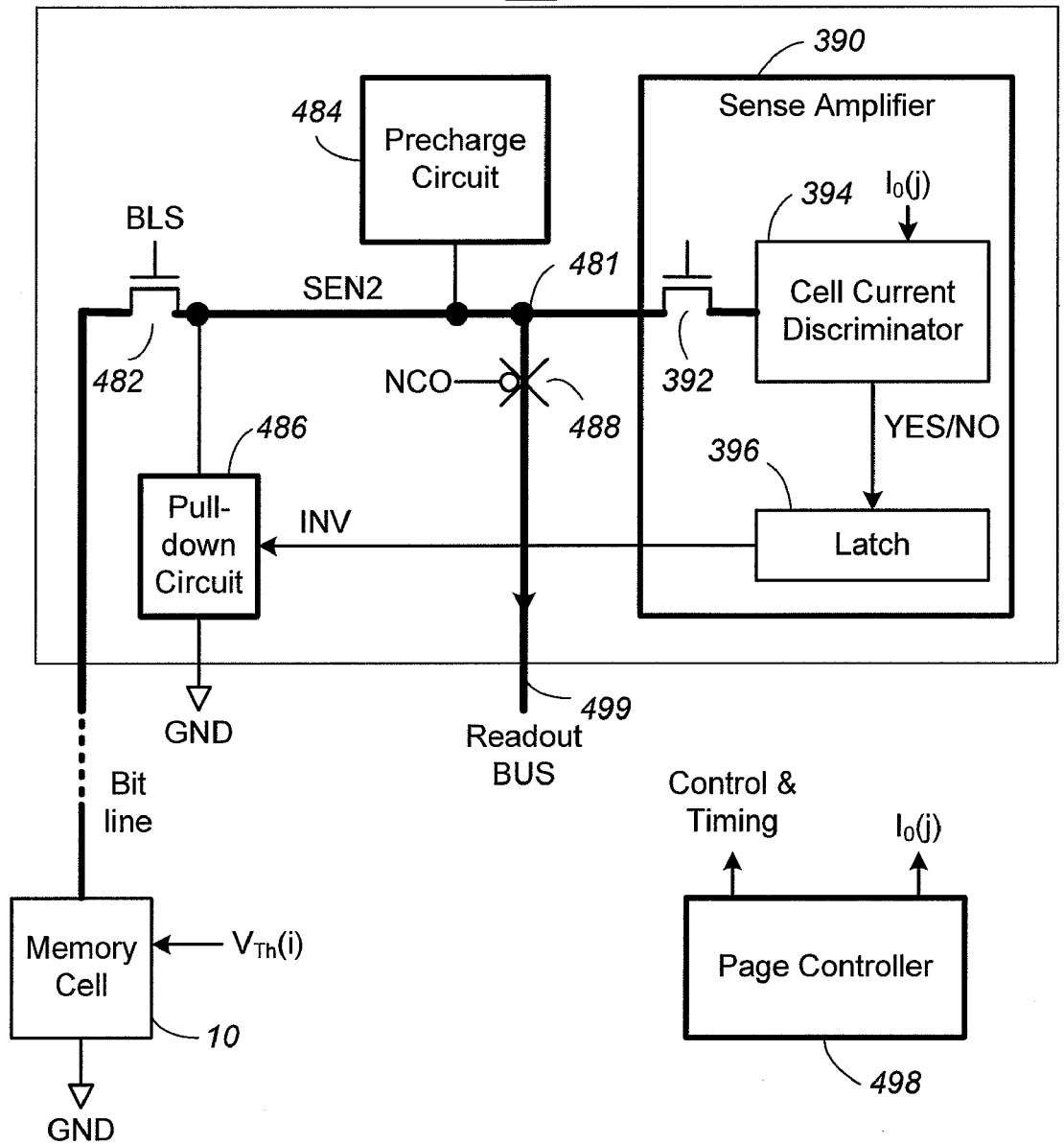
FIG. 10 is a schematic diagram illustrating a multi-pass sense module, according to a preferred embodiment of the invention.

FIG. 10 is a schematic diagram illustrating a multi-pass sense module, according to a preferred embodiment of the invention. The multi-pass sense module 380 senses the conduction current of a memory cell 10 via a coupled bit line 36. It has a sense node 481 that can be selectively connected a number of components. Initially, an isolation transistor 482, when enabled by a signal BLS connects the bit line 36 to the sense node 381. A precharge circuit 484 is coupled to the sense node 481. When the precharged circuit 484 is enabled, it brings the bit line voltage to a predetermined drain voltage appropriate for sensing. At the same time, the control gate of the memory cell is set to a predetermined threshold voltage $V_T(i)$ for a given memory state under consideration. This will induce a source-drain conduction current to flow in the memory cell 10, which may be sensed from the coupled bit line 36. The conduction current is a function of the charge programmed into the memory cell and the applied $V_T(i)$ when there exists a norminal voltage difference between the source and drain of the memory cell.

A sense amplifier 390 is then connected to the sense node to sense the conduction current in the memory cell 10. A cell current discriminator 394 serves as a discriminator or comparator of current levels. It determines whether the conduction current is higher or lower than a given demarcation current value $I_0(j)$. If it is higher, a latch 396 is set to a predetermined state. A pull-down circuit 486 is activiated in response to the latch 396 being set to the predetermined state, e.g., with INV being HIGH. This will pull down the sense node 481 and therefore the connected bit line 36 to ground voltage. This will inhibit the conduction current flow in the memory cell 10 irrespective of the control gate voltage since there will be no voltage difference between its source and drain.

In general, there will be a page of memory cells being operated on by a corresponding number of multi-pass sense modules 380. A page controller 498 supplies control and timing signals to each of the sense modules. In one embodiment, the page controller 498 is implemented as part of the state machine 312 in the control circuitry 310 shown in FIG. 6A. In another embodiment, the page controller is part of the read/write circuits 370. The page controller 498 cycles each of the multi-pass sense module 380 through a predetermined number of passes (j=1 to N) and also supplies a predetermined demarcation current value $I_0(j)$ for each pass. As will be seen in connection with FIG. 13 later, the demarcation current value can also be implemented as a time period for sensing. After the last pass, the page controller 498 enables a transfer gate 488 with a signal NCO to read the state of the sense node 481 as sensed data to a readout bus 499. In all, a page of sense data will be read out from all the multi-pass modules 380.

Figure 11:
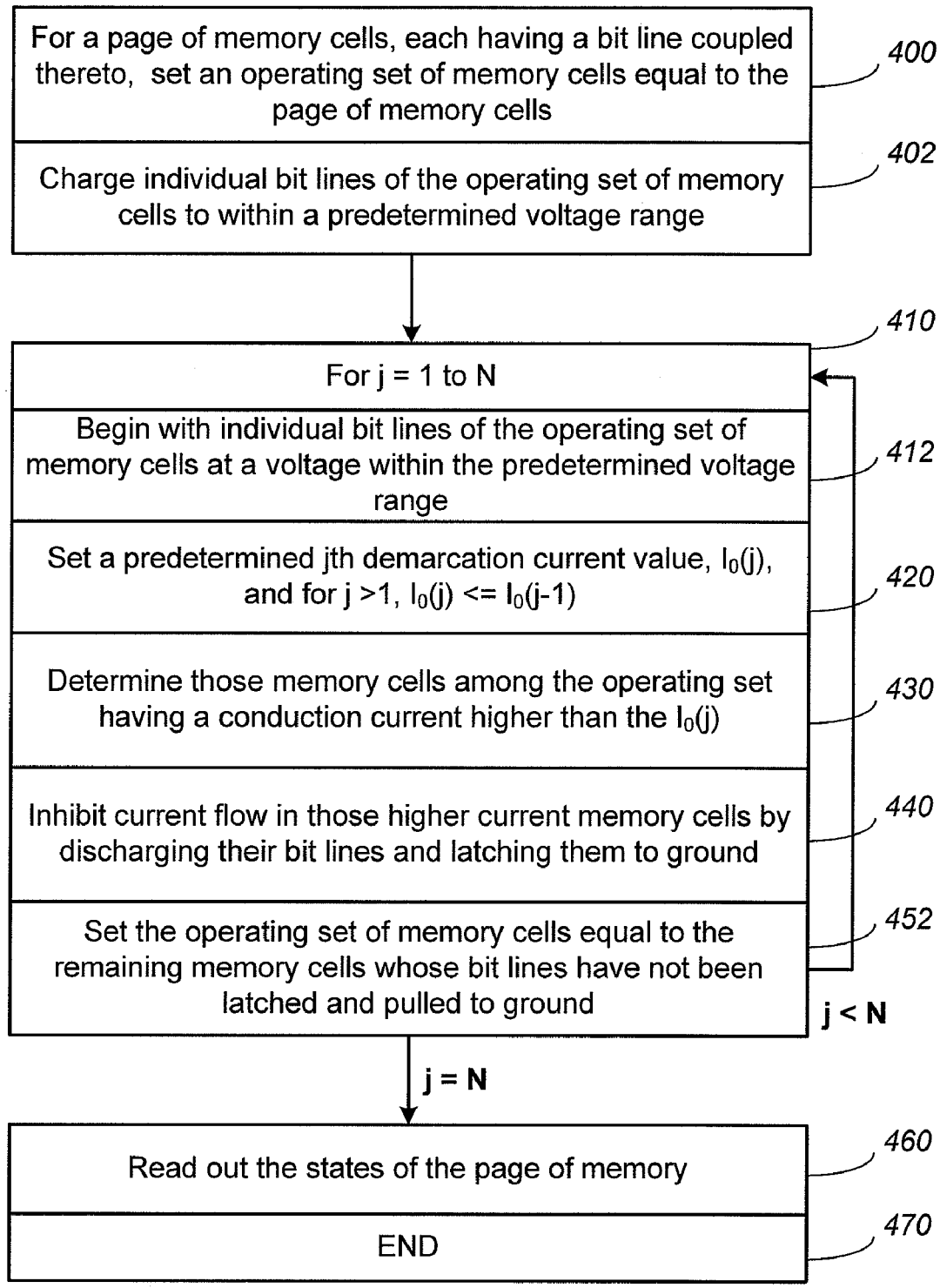
FIG. 11 is a flow diagram showing the operation of the multi-pass sense module of FIG. 10.

FIG. 11 is a flow diagram showing the operation of the multi-pass sense module of FIG. 10.

STEP 400: For a page of memory cells each having a bit line coupled to it, initially set an operating set of memory cells equal to the page of memory cells.

STEP 402: Charge individual bit lines of the operating set of memory cells to within a predetermined voltage range.

STEP 410: Begin the multi-pass j=1 to N.

STEP 412: Begin with individual bit lines of the operating set of memory cells at a voltage within the predetermined voltage range.

STEP 420: Set a demarcation current value, $I_0(j)$, where after the first pass j>1, $I_0(j)$ is less than or equal that of a previous pass j−1, i.e. $I_0(j)<=I_0(j-1)$.

STEP 430: Determine those memory cells among the operating set having a conduction current higher than the demarcation current value $I_0(j)$.

STEP 440: Inhibit further current flow in those memory cells with a conduction current higher than the demarcation current value $I_0(j)$.

STEP 452: Set the operating set of memory cells equal to the remaining memory cells whose bit lines have not been latched and pulled to ground. If j<N, return to STEP 410, otherwise proceed to STEP 460.

STEP 460: Read out the states of the page of memory cells.

STEP 470: End.

Sensing with Control of Bit Line to Bit Line Coupling

Figure 12:
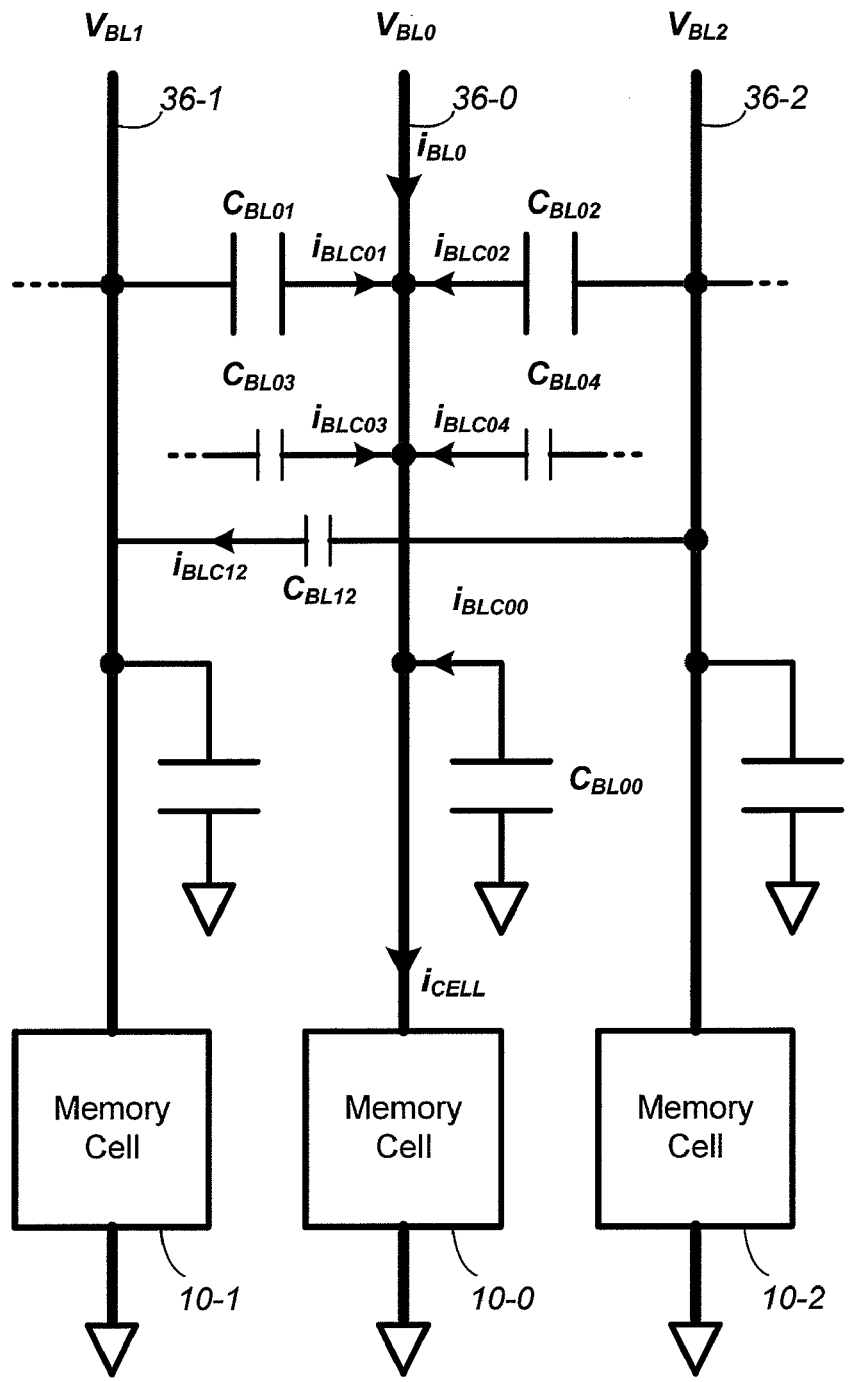
FIG. 12 illustrates three adjacent bit lines and the effect of capacitive couplings between them.

FIG. 12 illustrates three adjacent bit line and the effect of capacitive couplings between them. A memory cell 10-0 has two adjacent memory cells, 10-1 and 10-2. Similarly, coupled to the three memory cells are respectively three adjacent bit lines 36-0, 36-1 and 36-2. Each of the bit lines has its own self capacitance $C_{BL0}$, $C_{BL1}$ and $C_{BL2}$ respectively. The pair of adjacent bit lines 36-0 and 36-1 has mutual capacitance $C_{BL01}$. The pair of adjacent bit lines 36-0 and 36-1 has mutual capacitance $C_{BL02}$.

It can then be seen, there could be various branches of current flow due to the various capacitances. In particular, the currents due to each bit line self capacitance will result in:

$$i_{BLC0} = C_{BL0}\, d/dt\, V_{BL0},$$

$$i_{BLC1} = C_{BL1}\, d/dt\, V_{BL1}$$

$$i_{BLC2} = C_{BL2}\, d/dt\, V_{BL2}$$

Similarly, the cross current due to the pair of adjacent bit lines 36-0 and 36-1 is:

$$i_{BLC01} = C_{BL01}\, d/dt(V_{BL0} - V_{BL1}), \text{ and}$$

$$i_{BLC02} = C_{BL02}\, d/dt(V_{BL0} - V_{BL2}).$$

For the memory cell 10-0, the cell's conduction current is:

$$i_{CELL} \sim i_{BL0} + [i_{BLC00} + i_{BLC01} + i_{BLC02}].$$

The cell current given above is an approximation since it only includes contributions from adjacent bit lines. In general, for the bit line BL0 there will also be capacitance $C_{BL03}$ due to the non adjacent bit lines to the left as well as capacitance $C_{BL04}$ due to the non adjacent bit lines to the right. Similarly, there will be a mutual capacitance $C_{BL12}$ between non adjacent bit lines BL1 and BL2. These capacitance will contribute to displacement current flow dependent on a varying voltage across each capacitor. It has been estimated that the contributions from non adjacent bit lines amount to about ten percent of the contribution from the adjacent bit lines.

Also, since the sense module 380 is coupled to the bit line (see FIG. 10), the current it detected is $i_{BL0}$, which is not identical to $i_{CELL}$, because of the current contributions from the various bit line capacitances.

One prior art solution is to sense a memory cell while grounding the bit lines of adjacent cells. The conduction current in the memory cell is sensed by noting the rate of discharge through the capacitance of the coupled bit line. Thus, the conduction current can be derived from the rate of change of the bit line voltage. Referring to FIG. 12, this means that while the conduction current on the bit line BL0 36-0 is being sensed, the voltage $V_{BL1}$ on adjacent bit line BL1 36-1 and $V_{BL2}$ on adjacent bit line BL2 36-2 are set to zero. By shutting down the currents in adjacent bit lines, the crosstalk between adjacent bit lines is eliminated. However, since this prior art sensing results in a time varying $V_{BL0} = V_{BL0}(t)$, and by the equations given above, the self-capacitance of BL0 with respect to ground becomes $C_{BL00} + C_{BL01} + C_{BL02}$. This prior art sensing also does not eliminate displacement currents contributed from the non adjacent bit lines such as those associated with $C_{BL03}$, $C_{BL04}$, and $C_{BL12}$. These currents are smaller in magnitude, but nevertheless appreciable.

According to another aspect of the present invention, a memory device and a method thereof provide sensing a plurality of memory cells in parallel while minimizing errors caused by bit-line to bit-line coupling. Essentially, the bit line voltages of the plurality of bit line coupled to the plurality of memory cells are controlled such that the voltage difference between each adjacent pair of line lines is substantially independent of time while their conduction currents are being sensed. When this condition is imposed, all the currents due to the various bit line capacitance drop out since they all depend on a time varying voltage difference. Thus, from the equation above, since $[i_{BLC00} + i_{BLC01} + i_{BLC02}] = 0$, the current sensed from the bit line is identical to the cell's current, e.g., $i_{BL0} = i_{CELL}$.

Figure 13A:
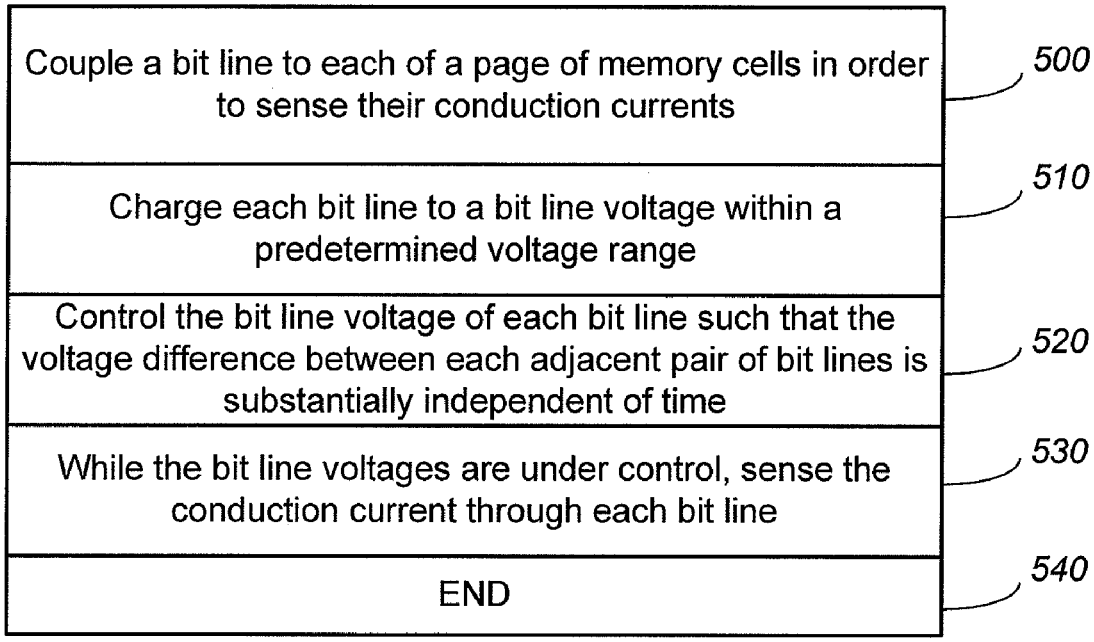
FIG. 13A is a flow diagram showing a method of sensing while reducing bit-line to bit-line coupling.

FIG. 13A is a flow diagram showing a method of sensing while reducing bit-line to bit-line coupling.
STEP 500: Couple a bit line to each of a page of memory cells in order to sense their conduction currents.
STEP 510: Charge each bit line to a bit line voltage within a predetermined voltage range.
STEP 520: Control the bit line voltage of each bit line such that the voltage difference between each adjacent pair of bit lines is substantially independent of time.
STEP 530: While the bit lines are under control, sense the conduction current through each bit line.
STEP 540: End.

According to another aspect of the present invention, in spite of the constant voltage condition, a sensing circuit and method allow determination of the memory cell's conduction current by noting the rate of voltage change of a given capacitor.

Figure 13B:
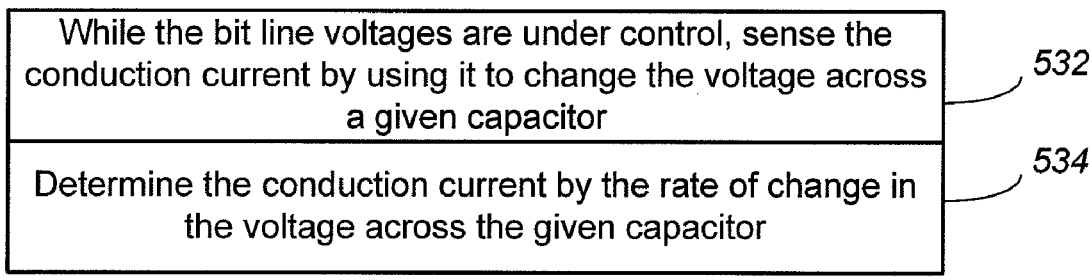
FIG. 13B is a flow diagram showing a more detailed embodiment of the sensing step shown in FIG. 13A.

FIG. 13B is a flow diagram showing a more detailed embodiment of the sensing step 530 shown in FIG. 13A.
STEP 532: While the bit lines are under control, sense the conduction current through each bit line by using it to change the voltage across a given capacitor.
STEP 534: Determine the conduction current by the rate of change in the voltage across the given capacitor.

Figure 14:
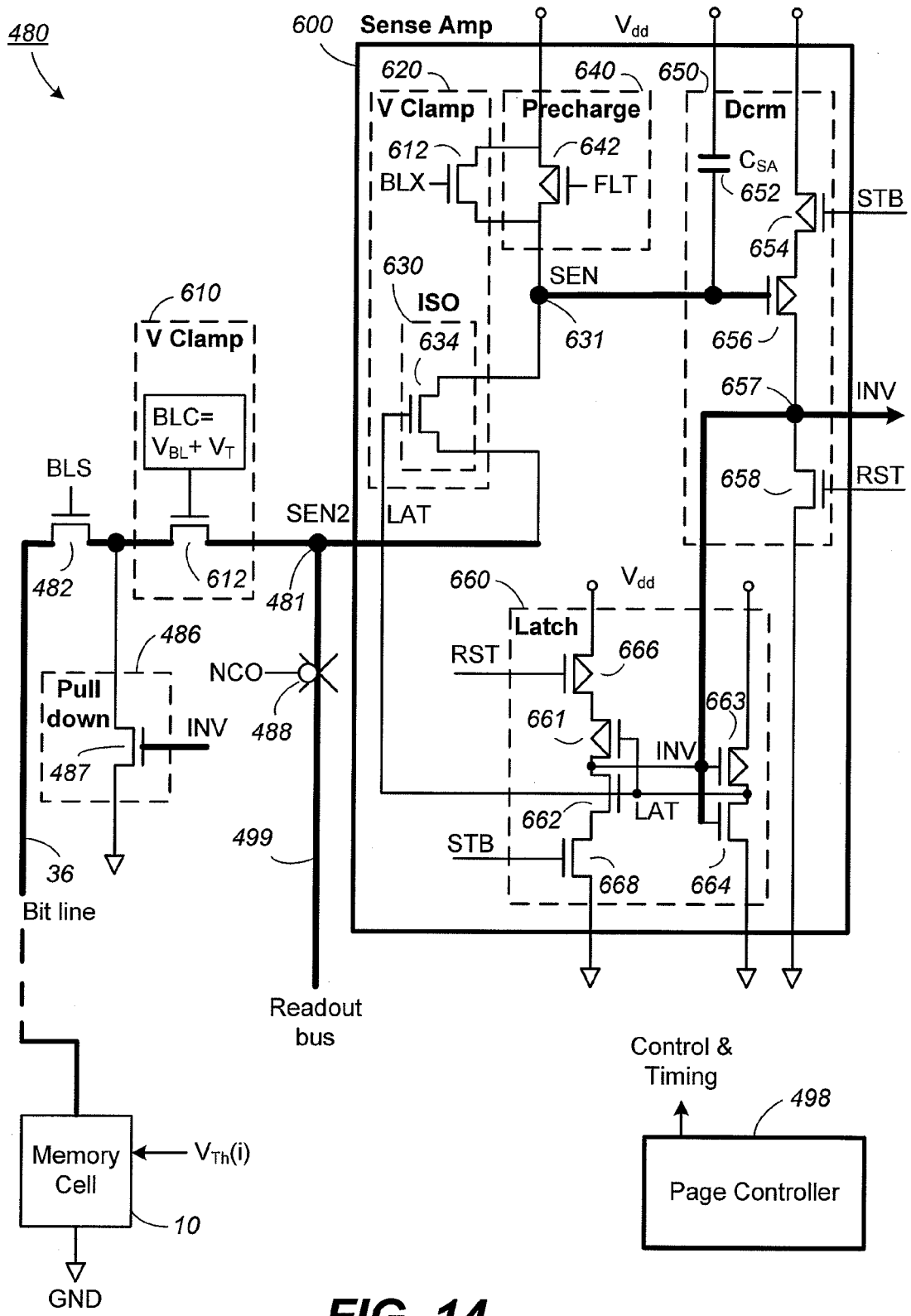
FIG. 14 illustrates a preferred sense module implementing the various aspects of the present invention.

FIG. 14 illustrates a preferred sense module implementing the various aspects of the present invention. The sense module 480 comprises a bit line isolation transistor 482, a bit line pull down circuit 486, a bit line voltage clamp 610, a readout bus transfer gate 488 and a sense amplifier 600.

The sense module 480 is connectable to the bit line 36 of a memory cell 10 when the bit line isolation transistor 482 is enabled by a signal BLS. The sense module 480 senses the conduction current of the memory cell 10 by means of the sense amplifier 600 and latches the read result as a digital voltage level SEN2 at a sense node 481 and outputs it to a readout bus 499.

The sense amplifier 600 essentially comprises a second voltage clamp 620, a precharge circuit 640, a discriminator or compare circuit 650 and a latch 660. The discriminator circuit 650 includes a dedicated capacitor 652.

The sense module 480 is similar to the multi-pass sense module 380 shown in FIG. 10. However, in FIG. 14, the precharge circuit 640 is implemented with a weak pull-up feature as will be described later. This serves as another way of identifying those cells with higher currents in order to turn them off for the purpose of reducing source line bias error.

The sense module 480 also has additional features for reducing bit-line to bit-line coupling. This is implemented by keeping the bit line voltage time-independent during sensing. This is accomplished by the bit line voltage clamp 610. As will be described below, the second voltage clamp 620 ensures the proper functioning of the bit line voltage clamp 610 under all sensing conditions. Also sensing is not done by the prior art method of noting the rate of discharging the capacitance of the bit line due to the conduction current, but the rate of discharging the dedicated capacitor 652 provided by the sense amplifier 600.

One feature of the sense module 480 is the incorporation of a constant voltage supply to the bit line during sensing in order to avoid bit line to bit line coupling. This is preferably implemented by the bit line voltage clamp 610. The bit line voltage clamp 610 operates like a diode clamp with a transistor 612 in series with the bit line 36. Its gate is biased to a constant voltage BLC equal to the desired bit line voltage $V_{BL}$ above its threshold voltage $V_T$. In this way, it isolates the bit line from the sense node 481 and set a constant voltage level for the bit line, such as the desired $V_{BL}$=0.5 to 0.7 volts. In general the bit line voltage level is set to a level such that it is sufficiently low to avoid a long precharge time, yet sufficiently high to avoid ground noise and other factors.

The sense amplifier 600 senses the conduction current through the sense node 481 and determines whether the conduction current is above or below a predetermined value. The sense amplifier outputs the sensed result in a digital form as the signal SEN2 at the sense node 481 to the readout bus 499.

The digital control signal INV, which is essentially an inverted state of the signal SEN2, is also output to control the pull down circuit 486. When the sensed conduction current is higher than the predetermined value, INV will be HIGH and SEN2 will be LOW. This result is reinforced by the pull down circuit 486. The pull down circuit 486 includes an n-transistor 487 controlled by the control signal INV.

The operation and timing of the sense module 480 will be described by reference to both FIG. 14 and the timing diagrams FIGS. 15(A)-15(K). FIGS. 15(A)-15(K) are demarcated into PHASES (1)-(9).

PHASE (0): The sense module 480 is connected to the bit line 36 via an enabling signal BLS (FIG. 15(A)(0).) The Voltage clamp is enabled with BLC. (FIG. 15(B)(0).) The Precharge circuit 640 is enabled as a limited current source with a control signal FLT (FIG. 15(C)(0).)

PHASE (1): Controlled Precharge

The sense amplifier 600 is initialized by a reset signal RST (FIG. 15(D)(1)) which will pull the signal INV to ground via the transistor 658 Thus on reset, INV is set to LOW. At the same time, a p-transistor 663 pulls a complimentary signal LAT to $V_{dd}$ or HIGH (FIG. 15(F)(1).)

The isolation gate 630 is formed by an n-transistor 634, which is controlled by the signal LAT. Thus after reset, the isolation gate is enabled to connect the sense node 481 to the sense amplifier's internal sense node 631, and the signal SEN2 will be the same as the signal SEN at the internal sense node 631.

The precharge circuit 640 precharges the bit line 36 through the internal sense node 631 and the sense node 481 for a predetermined period of time. This will bring the bit line to an optimum voltage for sensing the conduction therein.

The precharge circuit 640 includes a pull-up p-transistor 642 controlled by the control signal FLT ("FLOAT".) The bit line 36 will be pulled up towards the desired bit line voltage as set by the bit line voltage clamp 610. The rate of pull-up will depend on the conduction current in the bit line 36. The smaller the conduction current, the faster the pull-up.

Figure 15:
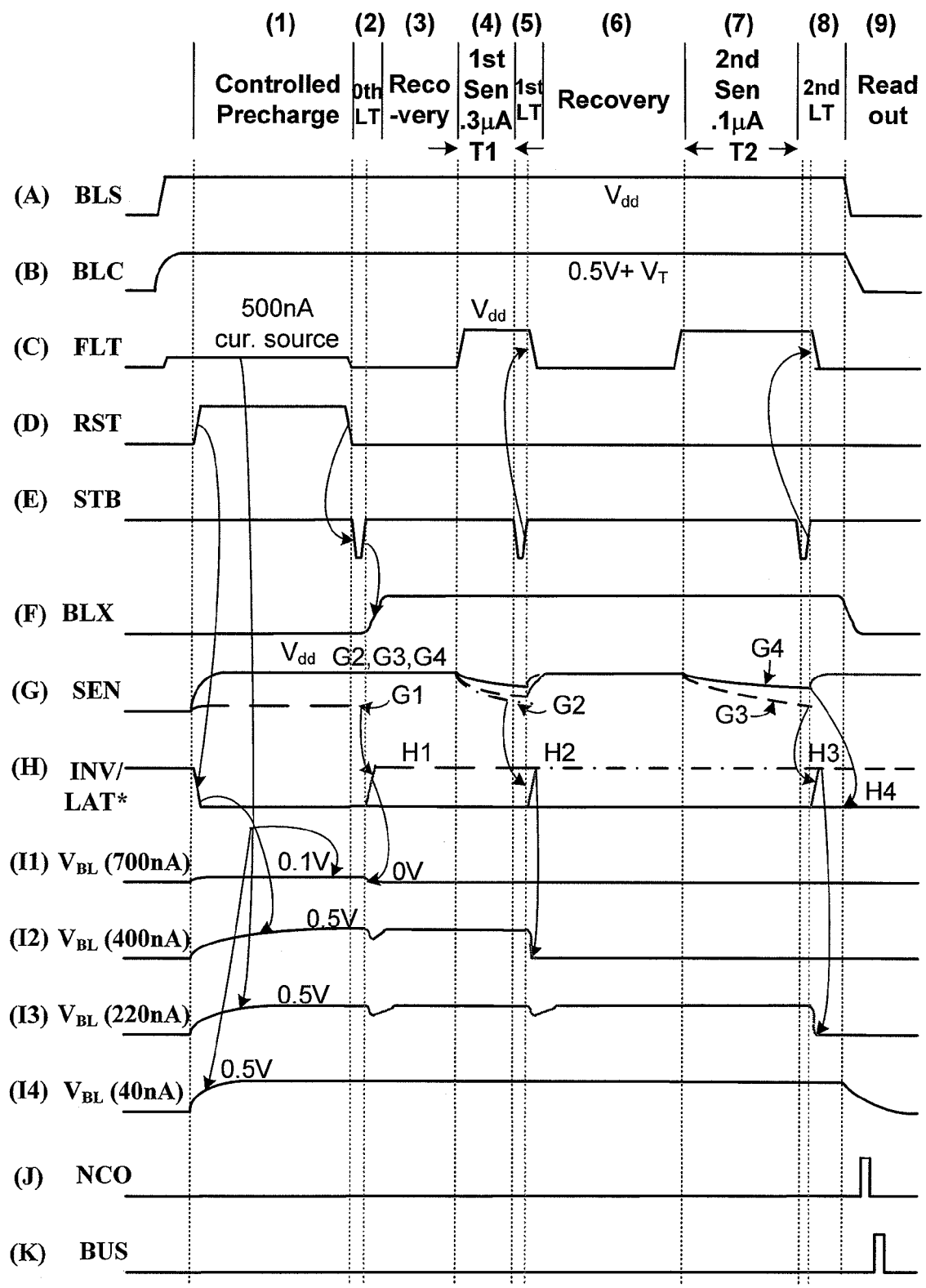
FIG. 15 (A)-FIG. 15(K) are timing diagrams for the sense module shown in FIG. 14.

FIGS. 15(H1)-15(H4) illustrate respectively the bit line voltages of memory cells having conduction currents of 700 nA, 400 nA, 220 nA and 40 nA.

It has been described earlier in connection with FIGS. 7-11 that sensing errors due to the source line bias are minimized if those memory cells with conduction currents higher than a predetermined value are turned off and their contributions to the source line bias eliminated.

According to another aspect of the invention, the precharge circuit 640 is implemented to serve two functions. One is to precharge the bit line to an optimum sensing voltage. The other is to help identify those memory cells with conduction currents higher than a predetermined value for D.C. (Direct Current) sensing so that they may be eliminated from contributing to source line bias.

The D.C. sensing is accomplished by providing a precharge circuit that behaves like a current source for supplying a predetermined current to the bit line. The signal FLT that controls the p-transistor 642 is such that it "programs" a predetermined current to flow through the precharge circuit 640. As an example, the FLT signal may be generated from a current mirror with a reference current set to 500 nA. When the p-transistor 642 forms the mirrored leg of the current mirror, it will also have the same 500 nA throwing in it.

FIGS. 15(I1)-15(I4) illustrate the voltages on four example bit lines connected respectively to memory cells with conduction currents of 700 nA, 400 nA, 220 nA and 40 nA. When the precharge circuit 640 is a current source with a limit of 500 nA, for example, a memory cell having a conduction current exceeding 500 nA will have the charges on the bit line drained faster than it can accumulate. Consequently, for the bit line with conduction current 700 nA, its voltage or the signal SEN at the internal sense node 631 will remain close to 0 v (FIG. 15(I1)(1).) On the other hand, if the memory cell's conduction current is below 500 nA, the precharge circuit 640 will begin to charge up the bit line and its voltage will begin to rise towards the clamped bit line voltage (e.g., 0.5 v set by the voltage clamp 610). (FIGS. 15(I2)(1)-15(I4)(1).) Correspondingly, the internal sense node 631 will either remain close to 0 v or be pulled up to $V_{dd}$ (FIG. 15(G).) Generally, the smaller the conduction current, the faster the bit line voltage will charge up to the clamped bit line voltage. Thus, by examining the voltage on a bit line after the controlled precharge phase, it is possible to identify if the connected memory cell has a conduction current higher or lower than a predetermined level.

PHASE (2): D.C. Latching & Removing the High Current Cells from Subsequent Sensing After the controlled precharge phase, an initial, D.C. high-current sensing phase begins where the signal SEN is sensed by the discriminator circuit 650. The sensing identifies those memory cells with conduction currents higher than the predetermined level. The discriminator circuit 650 includes two p-transistors 654 and 656 in series, which serve as a pull up for a node 657 registering the signal INV. The p-transistor 654 is enabled by a read strobe signal STB going LOW and the p-transistor 656 is enabled by the SEN signal at the internal sense node 631 going LOW. As explained earlier, the high current cells will have the signal SEN close to 0 v or at least unable for its bit lines to be precharged sufficient high to turn off the p-transistor 656. For example, if the weak pull up is limited to a current of 500 nA, it will fail to pull up a cell with conduction current of 700 nA (FIG. 15 (G1)(2).) When STB strobes LOW to latch, INV at the node 657 is pulled up to $V_{dd}$. This will set the latch circuit 660 with INV HIGH and LAT LOW (FIG. 15 (H1)(2).)

When INV is HIGH and LAT LOW, the isolation gate 630 is disabled and the sense node 481 is blocked from the internal sense node 631. At the same time, the bit line 36 is pulled to ground by the pull down circuit 486 (FIG. 15(I1)(2).) This will effective turn off any conduction current in the bit line, eliminating it from contributing to source line bias.

Thus, in one preferred implementation of the sense module 480, a limited-current source precharge circuit is employed. This provides an additional or alternative way (D.C. sensing) to identify bit lines carrying high currents and to turn them off to minimize source line bias error in subsequent sensing.

In another embodiment, the precharge circuit is not specifically configured to help identify high current bit lines but is optimized to pull up and precharge the bit line as fast as possible within the allowance of the maximum current available to the memory system.

PHASE (3): Recovery/Precharge

Prior to a sensing of the conduction current in a bit line such as bit line 36 that has not been previously pulled down, the precharge circuit is activated by the signal FLT to precharge the internal sense node 631 to $V_{dd}$ (FIG. 15(C)(3) and FIGS. 15(I2)(3)-15(I4)(3).)

PHASE (4): $1^{st}$ A.C. Sensing

The operation from here onwards is similar to the multi-pass sensing described in connection with FIGS. 10-11 in that the sense node is floated and its voltage changes during current sensing (A.C. or Alternate Current sensing.) The enhancement in FIG. 14 is that the sensing is performed with the bit line voltage kept constant to avoid bit-line to bit-line coupling.

In a preferred embodiment, an A.C. (Alternate Current) sensing is performed by determining the voltage drop at the floated internal sense node 631. This is accomplished by the discriminator or compare circuit 650 employing the capacitor $C_{SA}$ 652 coupled to the internal sense node 631, and considering the rate the conduction current is discharging it. In an integrated circuit environment, the capacitor 652 is typically implemented with a transistor. It has a predetermined capacitance, e.g., 30 fF, which can be selected for optimum current determination. The demarcation current value, typically in the range 100-1000 nA, can be set by appropriate adjustment of the discharging period.

The discriminator circuit 650 senses the signal SEN in the internal sense node 631. Prior to each sensing, the signal SEN at the internal sense node 631 is pull up to $V_{dd}$ by the precharge circuit 640. This will initially set the voltage across the capacitor 652 to be zero.

When the sense amplifier 600 is ready to sense, the precharge circuit 640 is disabled by FLT going HIGH (FIG. 15(C)(4).) The first sensing period T1 is set by the assertion of the strobe signal STB. During the sensing period, a conduction current induced by a conducting memory cell will discharge the capacitor. SEN will decrease from $V_{dd}$ as the capacitor 652 is discharging through the draining action of the conduction current in the bit line 36. FIGS. 15(G2)-15(G4) illustrate respectively the SEN signal corresponding to the remaining three example bit lines connected respectively to memory cells with conduction currents of 400 nA, 220 nA and 40 nA. The decrease being more rapid for those with a higher conduction current.

PHASE (5): $1^{st}$ A.C. Latching and Removal of Higher Current Cells from Subsequent Sensing At the end of the first predetermined sensing period, SEN will have decreased to some voltage depending on the conduction current in the bit line 36 (FIGS. 15(G2)(4)-15(G4)(4).) As an example, the demarcation current in this first phase is set to be at 300 nA. The capacitor $C_{SA}$ 652, the sensing period T1 and the threshold voltage of the p-transistor 656 are such that the signal SEN corresponding to a conduction current higher that the demarcation current (e.g., 300 nA) will drop sufficient low to turn on the transistor 656 in the discriminator circuit 650. When latching signal STB strobes LOW, the output signal INV will be pulled HIGH, and will be latched by the latch 660 (FIG. 15(E)(5) and FIG. 15(H2).) On the other hand, the signal SEN corresponding to a conduction current below the demarcation current will produce a signal SEN unable to turn on the transistor 656. In this case, the latch 660 will remain unchanged, in which case LAT remains HIGH (FIGS. 15(H3) and 15(H4).) Thus it can be seen that the discriminator circuit 650 effectively determines the magnitude of the conduction current in the bit line 36 relative to a reference current set by the sensing period.

The sense amplifier 600 also includes the second voltage clamp 620 whose purpose is to maintain the voltage of the drain of the transistor 612 sufficiently high in order for the bit line voltage clamp 610 to function properly. As described earlier, the bit line voltage clamp 610 clamps the bit line voltage to a predetermined value $V_{BL}$, e.g., 0.5 v. This will require the gate voltage BLC of the transistor 612 to be set at $V_{BL}+V_T$ (where $V_T$ is the threshold voltage of the transistor 612) and the drain connected to the sense node 481 to be greater than the source, i.e., the signal SEN2>$V_{BL}$. In particular, given the configurations of the voltage clamps 610 and 620, SEN2 should be no higher than the smaller of (LAT-$V_T$) or (BLX-$V_T$), and SEN should be no lower. During sensing, the isolation gate 630 is in a pass-through mode. However, during sensing the signal SEN at the internal sense node 631 has a voltage that decreases from $V_{dd}$. The second voltage clamp 620 prevents SEN from dropping to (LAT-$V_T$) or (BLX-$V_T$), whichever is lower. This is accomplished by an n-transistor 612 controlled by a signal BLX, where BLX is $\geq V_{BL}+2V_T$ (FIG. 15(F).) Thus, through the actions of the voltage clamps 610 and 620, the bit line voltage $V_{BL}$ is kept constant, e.g.~0.5 v during sensing.

Measuring current using a dedicated capacitor 652 instead of prior art's use of the bit line capacitance is advantageous in several respects. First, it allows a constant voltage source on the bit line thereby avoiding bit-line to bit-line crosstalk. Secondly, the dedicated capacitor 652 allows a capacitance to be selected that is optimal for sensing. For example, it may have a capacitance of about 30 fF as compared to a bit line capacitance of about 2 pF. A smaller capacitance can increase the sensing speed since it discharges faster. Finally, sensing relative to a dedicated capacitance as compared to the prior art method of using the capacitance of the bit line allows the sensing circuits to be independent of the memory architecture.

In another embodiment, the current determination is accomplished by comparison with a reference current, which may be provided by the conduction current of a reference memory cell. This could be implemented with the compare current as part of a current mirror.

The output of the current determination LAT is latched by the latch circuit 660. The latch circuit is formed as a Set/Reset latch by the transistors 661, 662, 663, and 664 together with the transistors 666 and 668. The p-transistor 666 is controlled by the signal RST (RESET) and the n-transistor 668 is controlled by the signal STB (STROBE or SET*.)

In general, there will be a page of memory cells being operated on by a corresponding number of multi-pass sense modules 480. For those memory cells having conduction current higher than the first demarcation current level, their LAT signal will be latch LOW. This in turns activates the bit line pull down circuit 486 to pull the corresponding bit lines to ground, thereby turn off their currents.

PHASE (6): Recovery/Precharge

Prior to the next sensing of the conduction current in a bit line such as bit line 36 that has not been previously pulled down, the precharge circuit is activated by the signal FLT to precharge the internal sense node 631 to $V_{dd}$ (FIG. 15(C)(6) and FIGS. 15(I3)(6)-15(I4)(6).)

PHASE (7): $2^{nd}$ Sensing

When the sense amplifier 600 is ready to sense, the precharge circuit 642 is disabled by FLT going HIGH (FIG. 15(C)(7).) The second sensing period T2 is set by the assertion of the strobe signal STB. During the sensing period, a conduction current, if any will discharge the capacitor. SEN will decrease from $V_{dd}$ as the capacitor 652 is discharging through the draining action of the conduction current in the bit line 36.

In accordance with the example before, the memory cells with conduction currents higher than 300 nA have already been identified and shut down in the earlier phases. FIGS. 15(G3)(7) and 15(G4)(7) illustrate respectively the SEN signal corresponding to the two example bit lines connected respectively to memory cells with conduction currents of 220 nA and 40 nA.

PHASE (8): $2^{nd}$ Latching for Reading Out

At the end of the second predetermined sensing period T2, SEN will have decreased to some voltage depending on the conduction current in the bit line 36 (FIGS. 15(G3)(7)-15(G4)(7).) As an example, the demarcation current in this second phase is set to be at 100 NA. In this case, the memory cell with the conduction current 220 nA will have its LAT latched LOW (FIG. 15(H3)(7)) and its bit line subsequently pulled to ground (FIG. 15(I3)(7).) On the other hand, the memory cell with the conduction current 40 nA will have no effect on the state of the latch, which was preset with LAT HIGH.

PHASE (9): Read Out to the Bus

Finally, in the read out phase, the control signal NCO at the transfer gate 488 allows the latched signal SEN2 to be read out to the readout bus 499 (FIGS. 15(J) and 15(K).)

A page controller such as the page controller 398 also shown in FIG. 10 supplies control and timing signals to each of the sense modules.

As can be seen from FIGS. 15(I1)-15(I4), the bit line voltage remains constant during each sensing period. Thus, from the discussion early, capacitive bit-line to bit-line coupling is eliminated.

The sense mode 480 shown in FIG. 14 is one preferred embodiment where sensing is performed with three passes. The first two passes being implemented to identify and shut down higher current memory cells. With the higher current contributions to the source line bias eliminated, the final pass is able to sense the cells with lower range conduction currents more accurately.

In other embodiments, sensing operations are implemented with different combination of D.C. and A.C. passes. Some even using only two or more A.C. passes. For the different passes, the demarcation current value used may be the same each time or converge progressively towards the demarcation current used in the final pass.

Management of the Errors Introduced by Neighboring Floating Gate Coupling

Another error inherent in high density integrated circuit, non-volatile memory device is due to neighboring floating gate coupling, as described earlier. The close proximity of the memory cells causes field perturbations from the charge elements of neighboring cells. According to another aspect of the present invention, the errors due to the perturbations are minimized by minimizing the change in the field environment of each cell between programming and reading. This is accomplished by programming all adjacent memory cells in a page thereof together. Since the individual memory cells and their neighbors are programmed together, it will ensure a minimum change in field environment seen by the individual cells from the time they are programmed to the time they are read.

This is in contrast to the prior art case of programming even and odd pages independently. In that case, after the memory cells of an even page have been programmed, the field contributed by their adjacent memory cells in an odd page may have changed radically when the odd page is programmed with a different set of data.

As described earlier, the number of memory cells in a "page" that are programmed or read simultaneously may vary according to the size of data sent or requested by a host system. Thus, there are several ways to program the memory cells coupled to a single word line, such as (1) programming even bit lines and odd bit lines separately, which may comprise upper page programming and lower page programming, (2) programming all the bit lines ("all-bit-line programming"), or (3) programming all the bit lines in a left or right page separately, which may comprise right page programming and a left page.

In existing non-volatile memory devices, a row of memory cells joined by the same word lines is configured into two interleaving pages. One page consists of memory cells of the even columns and the other page consists of memory cells of the odd columns. The even or odd pages are separately sensed and programmed. As mentioned earlier, this is necessitated by the need to control bit-line to bit-line coupling. Thus, it is preferable to ground alternate bit lines while read/write operations are performed on the other set of the bit lines.

However, as mentioned earlier, the interleaving page architecture is disadvantageous in at least three respects. First, it requires additional multiplexing circuitry. Secondly, it is slow in performance. To finish read or program of memory cells connected by a word line or in a row, two read or two program operations are required. Thirdly, it is also not optimum in reducing other disturb effects such as field coupling from neighboring charge storage elements.

All Bit Line Programming

As described in connection with FIGS. 12-15, it is possible by the present invention to control bit-line to bit-line coupling. Thus, there is no need to ground alternate bit lines during sensing or program verify, thereby relaxing the requirement to operate on even or odd pages with non-contiguous memory cells and speeding up verify operations.

According to another aspect of the invention, a contiguous page of memory cells are programming in parallel while bit-line to bit-line coupling is under control. This will minimize the extraneous field effects from neighboring floating gates.

The sense module shown in FIG. 6A, FIG. 10 and FIG. 14 is preferably implemented in a memory architecture configured to perform all-bit-line sensing. In other words, contiguous memory cells in a row are each connectable to a sense module to perform sensing in parallel. Such a memory architecture is also disclosed in co-pending and commonly assigned United States patent application, "Highly Compact Non-Volatile Memory And Method Thereof," by Raul-Adrian Cernea, filed on the same day as the present application. The entire disclosure of said patent application is hereby incorporated herein by reference.

Figure 16A:
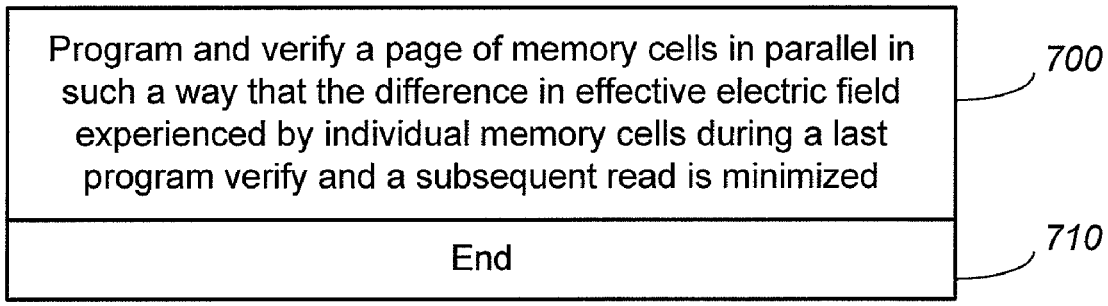
FIG. 16A is a flow diagram showing a method of programming and reading that reduces the errors due to neighboring floating gate coupling.

FIG. 16A is a flow diagram showing a method of programming and reading that reduces the errors due to neighboring floating gate coupling.

STEP 700: Program and verify a page of memory cells in parallel in such a way that the difference in effective electric field experienced by individual memory cells during a last program verify and a subsequent read is minimized.

STEP 710: End.

Figure 16B:
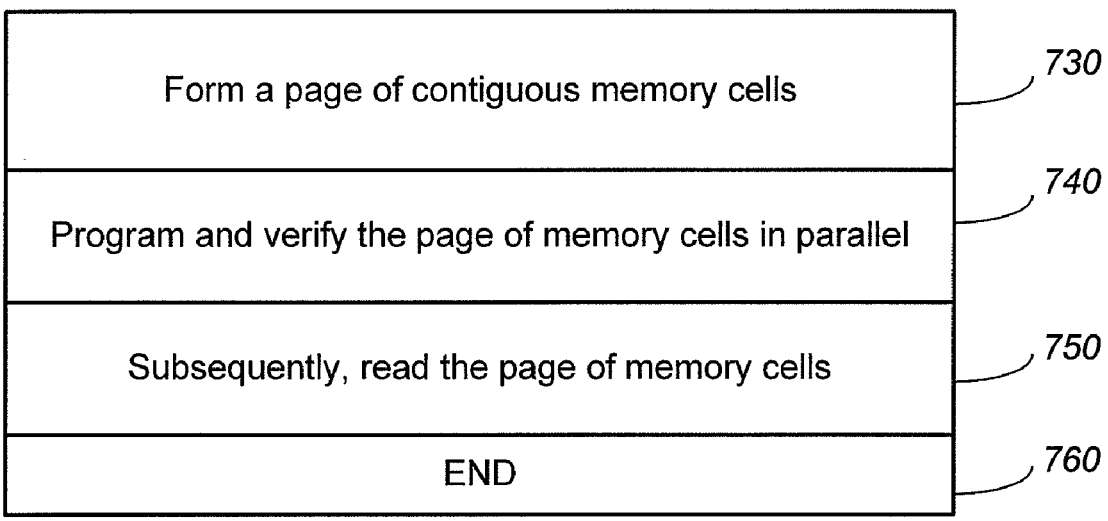
FIG. 16B is a flow diagram showing a preferred embodiment of the inventive step shown in FIG. 16A.

FIG. 16B is a flow diagram showing a preferred embodiment of the inventive step shown in FIG. 16A.

STEP 730: Form a page of contiguous memory cells.

STEP 740: Program and verify the page of memory cells in parallel.
STEP 750: Subsequently, read the page of memory cells
STEP 760: End.

Programming Left and Right Pages

Figure 17:
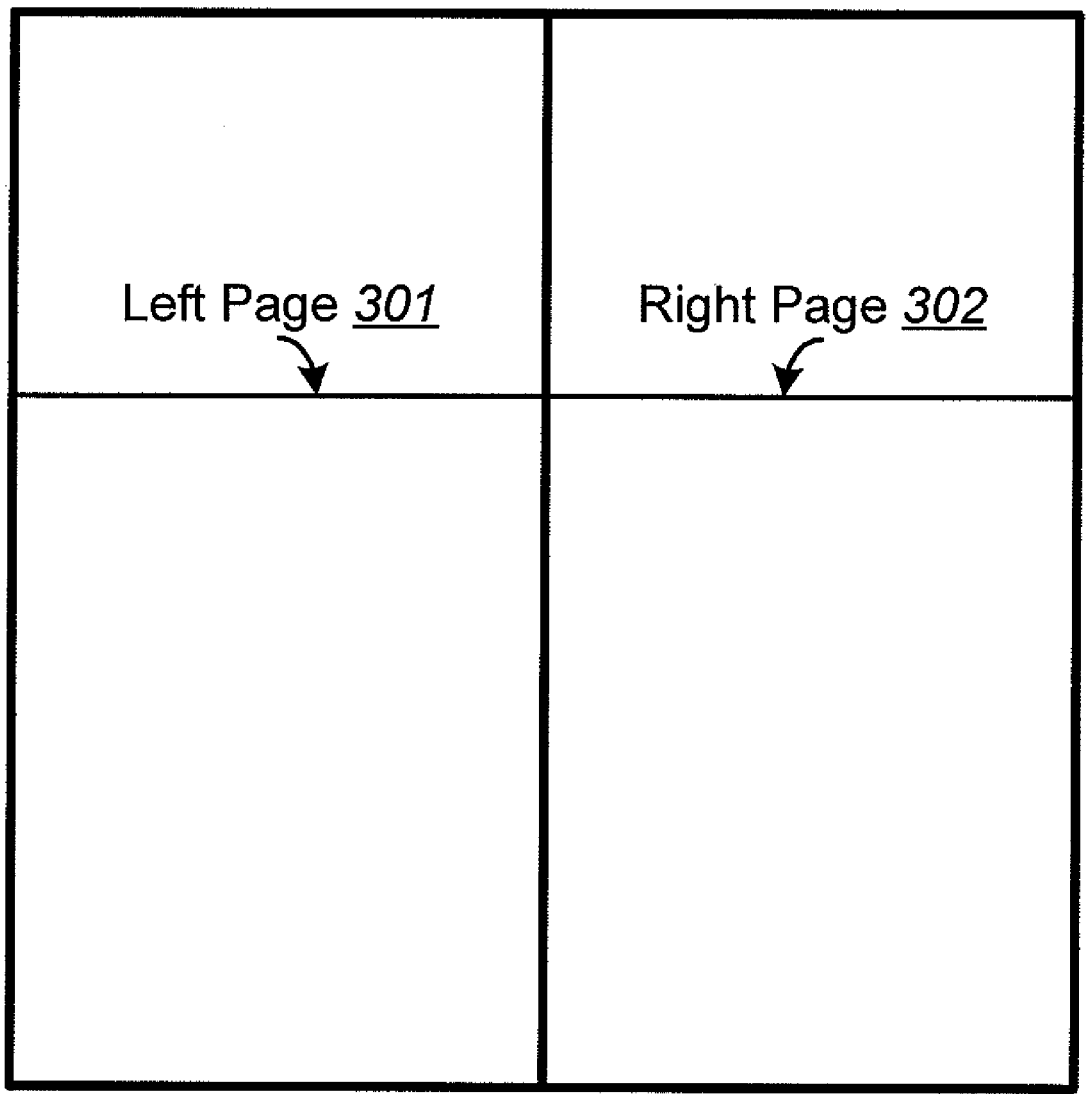
FIG. 17 illustrates a memory array similar to that shown in FIGS. 6A and 6B, except its architecture has each row of memory cells organized into a left page and a right page of memory cells.

FIG. 17 illustrates a memory array similar to that shown in FIGS. 6A and 6B, except its architecture has each row of memory cells organized into a left pages 301 and a right page 302 of memory cells. Each page consists of a plurality of contiguous memory cells. For example, each page may have 4,256 cells. In the preferred embodiment, programming is performed on the left page and the right page individually. To minimize interaction between the two independent pages, while one page is being programmed, the other page has all its bit lines grounded. Again, by having each page contiguous, neighboring floating gate coupling is reduced during programming.

Although the various aspects of the present invention have been described with respect to certain embodiments, it is understood that the invention is entitled to protection within the full scope of the appended claims.

The invention claimed is:

1. In a non-volatile memory device having a plurality of memory cells to be sensed in parallel, each memory cell having a source electrode, and the plurality of memory cells having their source electrodes tied together into a combined source line, and each memory cell having a drain electrode coupled to an associated bit line, a method of sensing comprising:
   (a) providing a predetermined demarcation current value to discriminate between two memory states;
   (b) providing a pulldown circuit for each associated bit line;
   (c) sensing the plurality of memory cells in parallel;
   (d) identifying those memory cells having conduction currents higher than said predetermined demarcation current value;
   (e) turning off the conduction currents of those higher current memory cells by enabling the associated pulldown circuits to ground the associated bit lines;
   (f) repeating (c) to (e) for a predetermined number of times; and
   (g) sensing the plurality of memory cells in parallel in a final pass.

2. The method of claim 1, wherein said predetermined number of times is zero.

3. The method of claim 1, wherein said predetermined number of times is one or greater.

4. The method of claim 1, wherein:
   the conduction currents of said plurality of memory cells are sensed though a plurality of associated bit lines; and
   said step of identifying those high current memory cells includes:
   precharging said plurality of associated bit lines with a constant current source having a predetermined current limitation;
   identifying those memory cells having conduction currents higher than said predetermined demarcation current value by their associated bit lines' precharging rates.

5. The method of claim 1, wherein:
   said sensing is performed by an associated plurality of sense amplifier in parallel; and
   said step of identifying those high current memory cells includes:
   identifying those memory cells by using their associated sense amplifiers to compare their conduction currents relative to said predetermined demarcation current value.

6. The method of claim 1, wherein:
   said plurality of memory cells is non-volatile memory.

7. The method of claim 1, wherein:
   said plurality of memory cells is flash BEPROM.

8. In a non-volatile memory device having a plurality of memory cells to be sensed in parallel, each memory cell having a source electrode, and the plurality of memory cells having their source electrodes tied together into a combined source line, and each memory cell having a drain electrode coupled to a bit line, a read system comprising:
   a controller; and
   a plurality of sensing circuits for sensing said plurality of memory cells in parallel, each sensing circuit further comprising:
      a discriminator coupled to receive a conduction current of an associated memory cell, said discriminator discriminating whether the conduction current is higher or lower than a predetermined demarcation current value;
      a latch being set to register the associated memory cell in response to said discriminator identifying a conduction current higher than said predetermined demarcation current value; and
      a pulldown circuit being enabled by said latch being set to pull the bit line of the associated memory cell to ground; and wherein
      said controller controls said plurality of sensing circuits to operate a predetermined number of times before reading out the determined memory state.

9. The read circuit as in claim 8, wherein said predetermined number of times is two.

10. The read circuit as in claim 8, wherein said predetermined number of times is greater than two 11. The read circuit as in claim 8, further comprising:
    a precharge circuit which is a constant current source having a predetermined current limitation; and wherein:
    the conduction currents of said plurality of memory cells are sensed though a plurality of associated bit lines;
    said precharge circuit pre charging said plurality of associated bit lines; and
    said plurality of sensing circuits identifying those memory cells having conduction currents higher than said predetermined demarcation current value by their associated bit lines' precharging rates.

12. The read circuit as in claim 8, wherein:
    said plurality of sensing circuits identifying those memory cells having conduction currents by comparing their conduction currents relative to said predetermined demarcation current value.

13. The read circuit as in claim 8, wherein:
    said plurality of memory cells is non-volatile memory.

14. The read circuit as in claim 8, wherein:
    said plurality of memory cells is flash EEPROM.

* * * * *

UNITED STATES PATENT AND TRADEMARK OFFICE
CERTIFICATE OF CORRECTION

PATENT NO. : 7,551,484 B2  Page 1 of 1
APPLICATION NO. : 11/620946
DATED : June 23, 2009
INVENTOR(S) : Cernea et al.

It is certified that error appears in the above-identified patent and that said Letters Patent is hereby corrected as shown below:

Column 24, line 10; after "flash", delete "BEPROM" and insert --EEPROM--.

Column 24, line 30; after "a", delete "pulidown" and insert --pulldown--.

Signed and Sealed this

Fourth Day of August, 2009

JOHN DOLL
*Acting Director of the United States Patent and Trademark Office*